US012757805B2

(12) United States Patent
Jang

(10) Patent No.: US 12,757,805 B2
(45) Date of Patent: Oct. 6, 2026

(54) SEMICONDUCTOR PACKAGE COMPRISING REDISTRIBUTION LAYER ON WAFER LEVEL CHIP SCALE PACKAGE (WLCSP)

(71) Applicant: SAMSUNG ELECTRONICS CO., LTD., Suwon-si (KR)

(72) Inventor: Hyungsun Jang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 385 days.

(21) Appl. No.: 18/459,821

(22) Filed: Sep. 1, 2023

(65) Prior Publication Data

US 2024/0128175 A1 Apr. 18, 2024

(30) Foreign Application Priority Data

Oct. 13, 2022 (KR) ........................ 10-2022-0131148

(51) Int. Cl.
*H10W 90/00* (2026.01)
*H10W 70/05* (2026.01)
(Continued)

(52) U.S. Cl.
CPC ......... *H10W 90/701* (2026.01); *H10W 70/65* (2026.01); *H10W 70/66* (2026.01);
(Continued)

(58) Field of Classification Search
CPC . H10W 90/794; H10W 74/129; H10W 70/05; H10W 70/685; H10W 90/701;
(Continued)

(56) References Cited

U.S. PATENT DOCUMENTS 8,937,388 B2 1/2015 Wu et al.
9,349,665 B2 5/2016 Chen et al.
(Continued)

FOREIGN PATENT DOCUMENTS

KR 10-2020-0058129 5/2020
KR 10-2021-0082638 A 7/2021

OTHER PUBLICATIONS

Office Action dated May 25, 2026 issued in corresponding to Korean Patent Application No. 10-2022-0131148.

*Primary Examiner* — Didarul A Mazumder
(74) *Attorney, Agent, or Firm* — Morgan, Lewis & Bockius LLP

(57) ABSTRACT

A semiconductor package includes: a semiconductor chip having chip pads disposed on a first surface thereof; a redistribution wiring layer formed on the first surface, wherein the redistribution wiring layer includes an insulating layer, redistribution wirings, a protective layer, and an under bump metallurgy (UBM) pad of UBM pads, wherein the insulating layer is formed on the first surface, wherein the redistribution wirings are provided on the insulating layer and are electrically connected to the chip pads, wherein the protective layer is provided on the insulating layer and has an opening that exposes at least a portion of a first redistribution wiring of the redistribution wirings, and wherein the under bump metallurgy (UBM) pad is provided on the at least a portion of the first redistribution wiring that is exposed by the opening; and conductive bumps disposed on the UBM pads of the redistribution wiring layer.

20 Claims, 24 Drawing Sheets

(51) Int. Cl.

| | |
|---|---|
| ***H10W 70/65*** | (2026.01) |
| ***H10W 70/66*** | (2026.01) |
| ***H10W 70/685*** | (2026.01) |
| ***H10W 74/01*** | (2026.01) |
| ***H10W 74/10*** | (2026.01) |

(52) U.S. Cl.
CPC ....... *H10W 70/685* (2026.01); *H10W 74/137* (2026.01); *H10W 70/05* (2026.01); *H10W 74/014* (2026.01); *H10W 90/794* (2026.01)

(58) Field of Classification Search
CPC ... H10W 74/014; H10W 70/66; H10W 70/60; H10W 72/942; H10W 70/65; H10W 72/29; H10W 72/90
USPC ........................................................... 257/734
See application file for complete search history.

(56) References Cited

U.S. PATENT DOCUMENTS

| | | | | |
|---|---|---|---|---|
| 9,899,584 | B2 | 2/2018 | Hwang | |
| 10,026,668 | B1 * | 7/2018 | Lee ..................... | H10W 74/117 |
| 10,109,607 | B2 | 10/2018 | Chen et al. | |
| 10,199,551 | B2 | 2/2019 | Kim et al. | |
| 11,164,832 | B2 | 11/2021 | Chen et al. | |
| 2013/0113095 | A1 * | 5/2013 | Chuang ............... | H10W 74/131 257/737 |
| 2013/0307119 | A1 * | 11/2013 | Chen ................... | H10W 70/685 257/532 |
| 2014/0264839 | A1 * | 9/2014 | Tsai .................... | H10W 42/121 257/737 |
| 2015/0123269 | A1 * | 5/2015 | Chen ................... | H10W 42/121 257/737 |
| 2017/0005052 | A1 * | 1/2017 | Chen ................... | H10W 20/063 |
| 2019/0067230 | A1 * | 2/2019 | Liu ....................... | H10W 72/20 |

* cited by examiner

SEMICONDUCTOR PACKAGE COMPRISING REDISTRIBUTION LAYER ON WAFER LEVEL CHIP SCALE PACKAGE (WLCSP)

CROSS-REFERENCE TO RELATED APPLICATION

This application claims priority under 35 U.S.C. § 119 to Korean Patent Application No. 10-2022-0131148, filed on Oct. 13, 2022 in the Korean Intellectual Property Office (KIPO), the disclosure of which is herein incorporated by reference herein in its entirety.

TECHNICAL FIELD

Example embodiments of the present inventive concept relate to a semiconductor package and a method of manufacturing the semiconductor package. More particularly, example embodiments of the present inventive concept relate to a wafer level package and a method of manufacturing the same.

DISCUSSION OF THE RELATED ART

Generally, a semiconductor package such as a wafer level chip scale package (WLCSP) or a fan-out wafer level package (FOWLP) may be mounted on a module board, an interposer, etc. using solder bumps that are formed on a redistribution wiring layer. To distribute stress during mounting of the semiconductor package, a bonding pad structure such as an under bump metallurgy (UBM) pad may be disposed under the solder bump to increase board level reliability (BLR). However, since an edge portion of the UBM pad may overlap a protective layer formed on a redistribution pad, an interface adhesive force may become weak due to a difference in thermal expansion coefficients at the heterogeneous interface between a metal material of the UBM pad and a polymer material of the protective layer, thereby causing a peeling phenomenon.

SUMMARY

According to an example embodiment of the present inventive concept, a semiconductor package includes: a semiconductor chip having chip pads disposed on a first surface thereof; a redistribution wiring layer formed on the first surface of the semiconductor chip, wherein the redistribution wiring layer includes at least one insulating layer, redistribution wirings, a protective layer, and an under bump metallurgy (UBM) pad of UBM pads, wherein the at least one insulating layer is formed on the first surface of the semiconductor chip, wherein the redistribution wirings are provided on the at least one insulating layer and are electrically connected to the chip pads, wherein the protective layer is provided on the at least one insulating layer and has an opening that exposes at least a portion of a first redistribution wiring of the redistribution wirings, and wherein the under bump metallurgy (UBM) pad is provided on the at least a portion of the first redistribution wiring that is exposed by the opening of the protective layer and spaced apart from an inner wall of the opening of the protective layer; and conductive bumps disposed on the UBM pads of the redistribution wiring layer.

According to an example embodiment of the present inventive concept, a semiconductor package includes: a semiconductor chip having chip pads disposed on a first surface thereof; a redistribution wiring layer covering the first surface of the semiconductor chip and having redistribution wirings electrically connected to the chip pads; and conductive bumps disposed on an outer surface of the redistribution wiring layer and electrically connected to the redistribution wirings, wherein the redistribution wiring layer includes: at least one insulating layer in which the redistribution wirings are provided; a protective layer provided on the at least one insulating layer and having an opening that exposes at least a portion of a first redistribution wiring among the redistribution wirings; and a bonding pad provided on the at least a portion of the first redistribution wiring that is exposed by the opening of the protective layer and spaced apart from an inner wall of the opening of the protective layer, and wherein a conductive bump of the conductive bumps is disposed on the bonding pad.

According to an example embodiment of the present inventive concept, a semiconductor package includes: a redistribution wiring layer having a first surface and a second surface that is opposite to the first surface, wherein the redistribution wiring layer includes at least one insulating layer and redistribution wirings provided in the at least one insulating layer; a semiconductor chip arranged on the first surface of the redistribution wiring layer and having chip pads that are electrically connected to the redistribution wirings; and outer connection members disposed on the second surface of the redistribution wiring layer and electrically connected to the redistribution wirings, wherein the redistribution wiring layer further includes: a protective layer provided on the at least one insulating layer and having an opening that exposes at least a portion of a first redistribution wiring among the redistribution wirings; and a bonding pad provided on the at least a portion of the first redistribution wiring that is exposed by the opening of the protective layer and is spaced apart from an inner wall of the opening of the protective layer, and wherein an outer connection member of outer connection members is arranged on the bonding pad and covers a portion of the first redistribution wiring that is exposed by the bonding pad.

BRIEF DESCRIPTION OF THE DRAWINGS

The above and other features of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be explained in detail with reference to the accompanying drawings.

Figure 1:
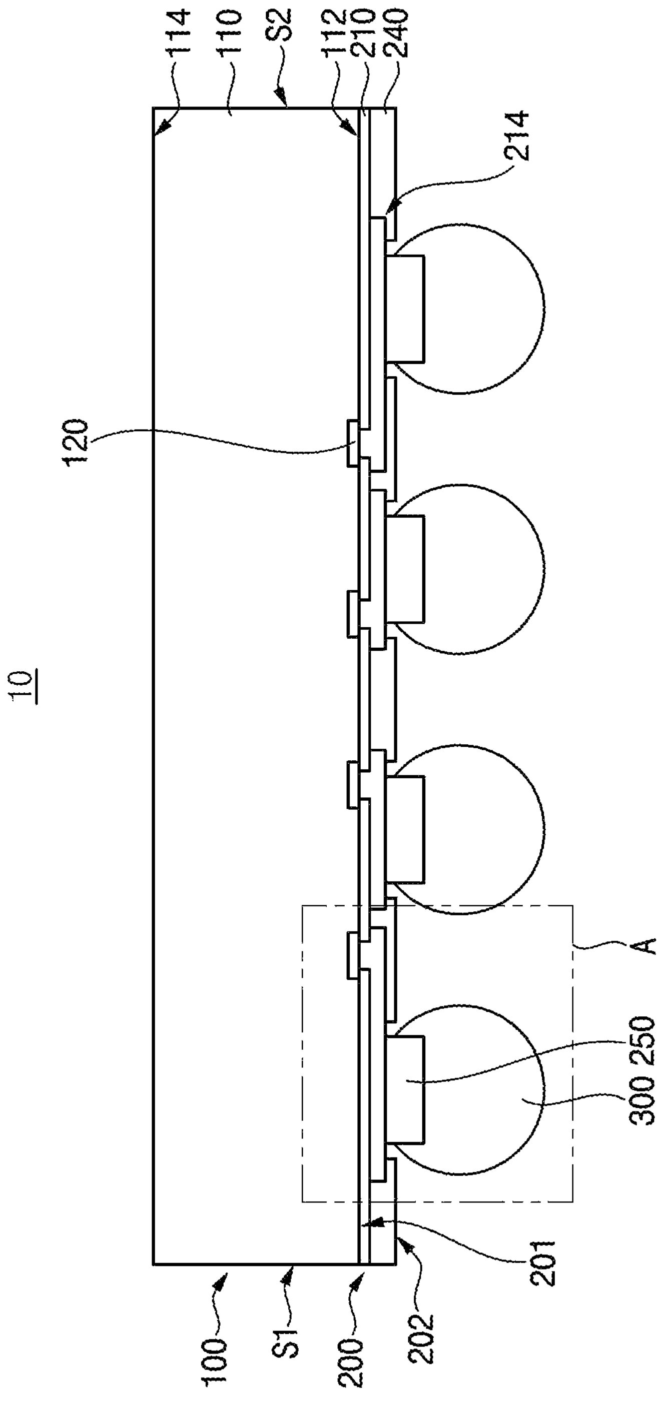
FIG. 1 is a cross-sectional view illustrating a semiconductor package in accordance with an example embodiment of the present inventive concept.
Figure 2:
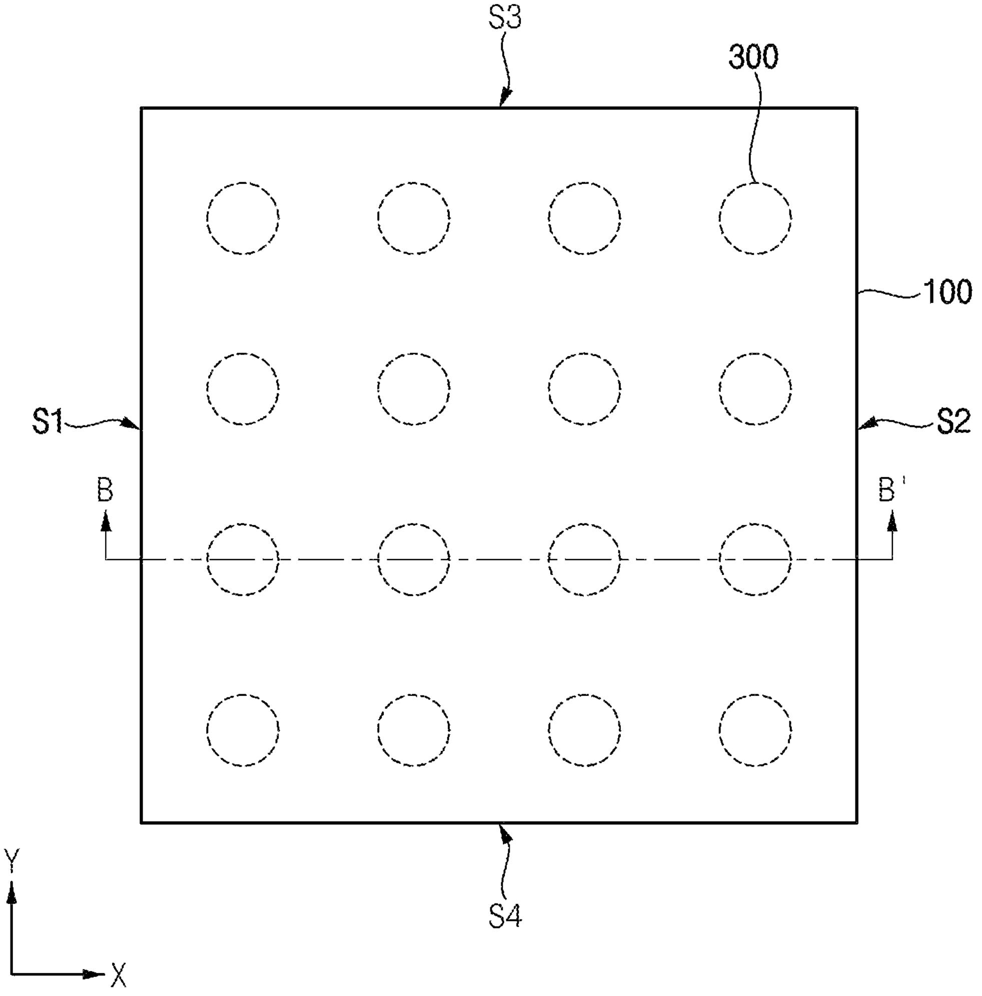
FIG. 2 is a plan view illustrating the semiconductor package in FIG. 1.
Figure 3:
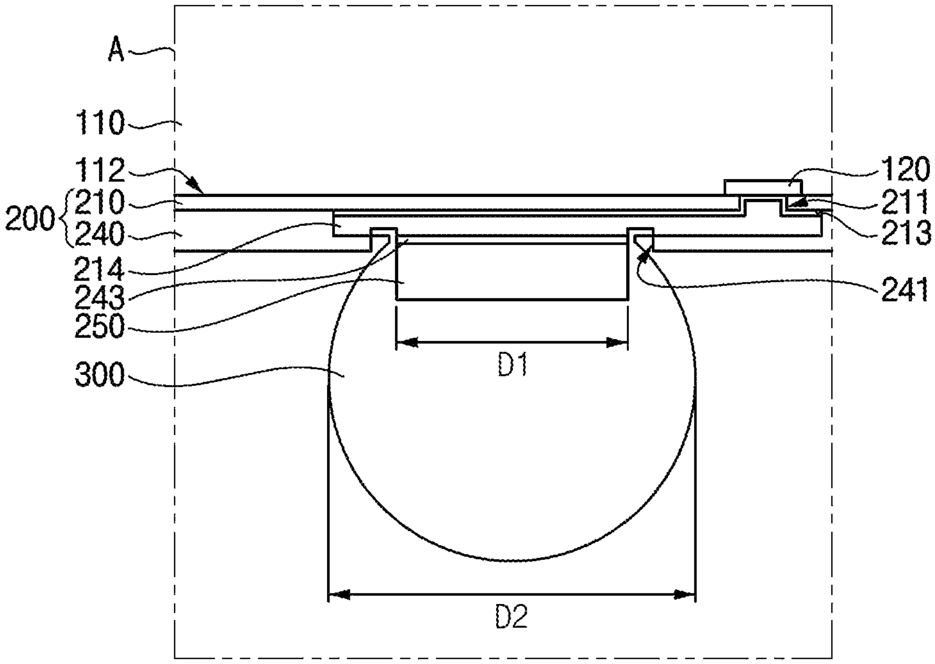
FIG. 3 is an enlarged cross-sectional view illustrating portion 'A' in FIG. 1.
Figure 4:
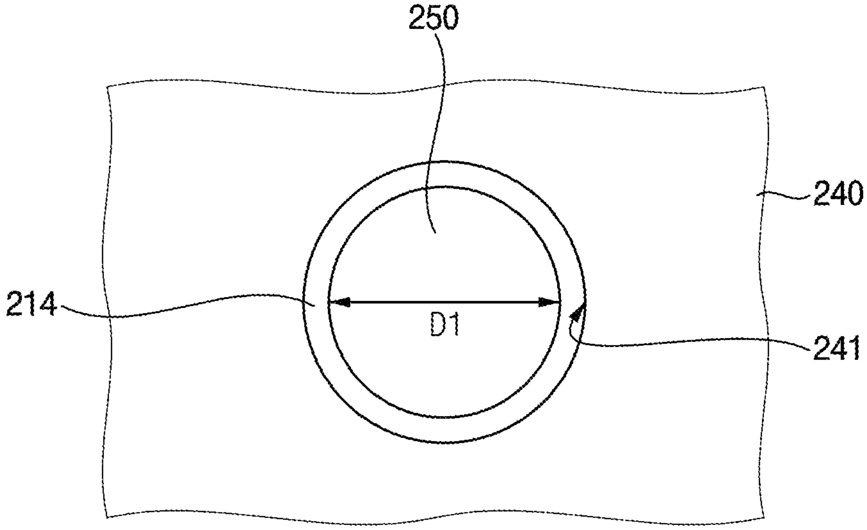
FIG. 4 is a plan view illustrating an UBM pad in FIG. 3.

FIG. 1 is a cross-sectional view illustrating a semiconductor package in accordance with an example embodiment of the present inventive concept. FIG. 2 is a plan view illustrating the semiconductor package in FIG. 1. FIG. 3 is an enlarged cross-sectional view illustrating portion 'A' in FIG. 1. FIG. 4 is a plan view illustrating an UBM pad in FIG. 3. FIG. 1 is a cross-sectional view taken along the line B-B' in FIG. 2. FIG. 4 is a plan view illustrating the UBM pad, wherein a conductive bump on the UBM pad is omitted.

Referring to FIGS. 1 to 4, a semiconductor package 10 may include a semiconductor chip 100, a redistribution wiring layer 200 disposed on one surface of the semiconductor chip 100 and external connection members 300 disposed on an outer surface of the redistribution wiring layer 200.

In an example embodiment of the present inventive concept, the semiconductor package 10 may be a wafer level chip scale package (WLCSP). The semiconductor chip 100 of the semiconductor package 10 may include, for example, a Power Management Integrated Circuit (PMIC). The semiconductor chip 100 may include an integrated circuit for performing functions related to a power source, such as a power management semiconductor, battery management, a DC-DC converter, etc.

In an example embodiment of the present inventive concept, the semiconductor chip 100 may include a substrate 110 having a first surface 112 and a second surface 114 opposite to the first surface 112. Circuit elements may be formed on the first surface 112 of the substrate 110. The circuit elements may include, for example, transistors, capacitors, wiring structures, etc. An insulation interlayer may be formed on the first surface 112 of the substrate 110 to cover the circuit elements.

A plurality of chip pads 120 may be formed on the first surface 112 of the substrate 110. The chip pads 120 may be electrically connected to the circuit elements through contact plugs in the insulation interlayer. For example, the contact plugs may be in substrate 110. A passivation layer may be formed on the insulation interlayer on the first surface 112 of the substrate 110. At least portions of the chip pads 120 may be exposed by the passivation layer.

Although only some chip pads are illustrated in the figures, structures and arrangements of the chip pads are provided as examples, and it will be understood that the present inventive concept is not limited thereto.

As illustrated in FIG. 2, the semiconductor chip 200 may have a first side surface S1 and a second side surface S2 extending in a direction parallel with a first direction (Y direction) and opposite to each other. The semiconductor chip 200 may further include a third side surface S3 and a fourth side surface S4 extending in a direction parallel with a second direction (X direction) substantially perpendicular to the first direction and opposite to each other.

In an example embodiment of the present inventive concept, the redistribution wiring layer 200 may be provided on the first surface 112 of the substrate 110. The redistribution wiring layer 200 may include at least one insulating layer 210 and redistribution wirings 214 provided in the at least one insulating layer and electrically connected to the chip pads 120.

For example, the insulating layer 210 may be provided on the first surface 112 of the substrate 110. The insulating layer 210 may have first openings 211 that expose the chip pads 120, respectively. The insulating layer 210 may include a polymer or a dielectric layer. For example, the insulating layer may include a photosensitive dielectric layer such as PID (photo imagable dielectric).

The redistribution wirings 214 may be provided on the insulating layer 210 and may be electrically connected to the chip pads 120 through the first openings 211. The redistribution wiring may include, for example, aluminum (Al), copper (Cu), tin (Sn), nickel (Ni), gold (Au), platinum (Pt), or an alloy thereof. The redistribution wiring 214 may be formed by a plating process, an electroless plating process, a vapor deposition process, etc.

In an example embodiment of the present inventive concept, the redistribution wiring layer 200 may include a protective layer 240 and an under bump metallurgy (UBM) pad 250. The protective layer 240 may be provided on the insulating layer 210, and the under bump metallurgy (UBM) pad 250 may be a bonding pad provided on a portion of the redistribution wiring 214 that is exposed by the protective layer 240.

For example, the protective layer 240 may have a second opening 241 that exposes at least a portion of the redistribution wiring 214. For example, the protective layer 240 may serve as a passivation layer that exposes at least portions of the redistribution wirings 214. For example, the passivation layer may include a photosensitive dielectric layer such as photo imagable dielectric (PID). For example, the protective layer 240 may be formed by a vapor deposition process, a spin coating process, etc.

As illustrated in FIG. 4, the UBM pad 250 may be spaced apart from an inner wall of the second opening 241 of the protective layer 240. An entire lower surface of the UBM pad 250 may be bonded to the portion of the redistribution wiring 214 that is exposed through the second opening 241. For example, the UBM pad may have a diameter of at least, about, 5 μm. The diameter D1 of the UBM pad may be within a range of about 5 μm to about 200 μm. The UBM pad 250 may include a metal material such as copper.

In this embodiment, the redistribution wiring layer 200 may include the insulating layer 210 formed as one layer and the redistribution wiring 214 provided on the insulating layer 210. However, the present inventive concept might not be limited thereto, and for example, the redistribution wiring layer 214 may include first and second insulating layers, which are stacked in at least two layers, and first and second redistribution wirings that are respectively provided in the first and second insulating layers. In this case, the second redistribution wiring corresponds to an uppermost redistribution wiring among the redistribution wirings, and the protective layer may be provided on the second insulating layer and may have an opening that exposes at least a portion of the uppermost redistribution wiring (i.e., the second redistribution wiring). Further in this case, the UBM pad may be formed on the at least a portion of the uppermost redistribution wiring (i.e., the second redistribution wiring) that is exposed by the opening of the second insulating layer.

In an example embodiment of the present inventive concept, the conductive bumps 300 as external connection members may be respectively disposed on the UBM pads 250 of the redistribution wiring layer 200. For example, the conductive bumps 300 may include solder bumps or solder balls.

As illustrated in FIG. 3, the conductive bump 300 may contact a portion of the redistribution wiring 214 exposed by the UBM pad 250. The conductive bump 300 may cover the portion of the redistribution wiring 214 that is exposed by the UBM pad 250. For example, the conductive bump 300 may completely cover the portion of the redistribution wiring 214 exposed by the UBM pad 250. For example, a diameter D2 of the conductive bump 300 may be within a range of about 10 μm to about 200 μm.

As described above, the semiconductor package 10 may include the semiconductor chip 100, the redistribution wiring layer 200, and the conductive bumps 300. The semiconductor chip 100 has the chip pads 120 disposed on the first surface 112 thereof, and the redistribution wiring layer 200 covers the first surface 112 of the semiconductor chip 100 and has the redistribution wirings 214 that are electrically connected to the chip pads 120. The conductive bumps 300 are disposed on the outer surface of the redistribution wiring layer 200 and are electrically connected to the redistribution wirings 214.

The redistribution wiring layer 200 may include at least one insulating layer 210, the protective layer 240, and the UBM pad 250. The redistribution wirings 214 are provided on the at least one insulating layer 210, and the protective layer 240 is provided on the at least one insulating layer 210 and includes the second opening 241 that exposes at least a portion of the uppermost redistribution wiring 214 of the redistribution wirings 214. The UBM pad 250 is disposed on the at least a portion of the uppermost redistribution wiring 214 that is exposed by the second opening 241 and is spaced apart from the inner wall of the second opening 241. The conductive bump 300 may be disposed on the UBM pad 250.

The lower surface of the UBM pad 250 may be bonded to the portion of the redistribution wiring 214 that is exposed through the second opening 241. For example, the entire lower surface of the UBM pad 250 may be bonded to the portion of the redistribution wiring 214 that is exposed through the second opening 241. The conductive bump 300 may cover the portion of the redistribution wiring 214 that is exposed by the UBM pad 250. For example, the conductive bump 300 may completely cover the portion of the redistribution wiring 214 that is exposed by the UBM pad 250.

Accordingly, an edge portion of the UBM pad 250 may be bonded to the underlying redistribution wiring 214 without being disposed on the protective layer 240. Since the UBM pad 250 and the redistribution wiring 214 include the same metal material as each other, lifting due to a difference in thermal expansion coefficients therebetween may be prevented to increase board level reliability.

Hereinafter, a method of manufacturing the semiconductor package of FIG. 1 will be described.

Figure 5:
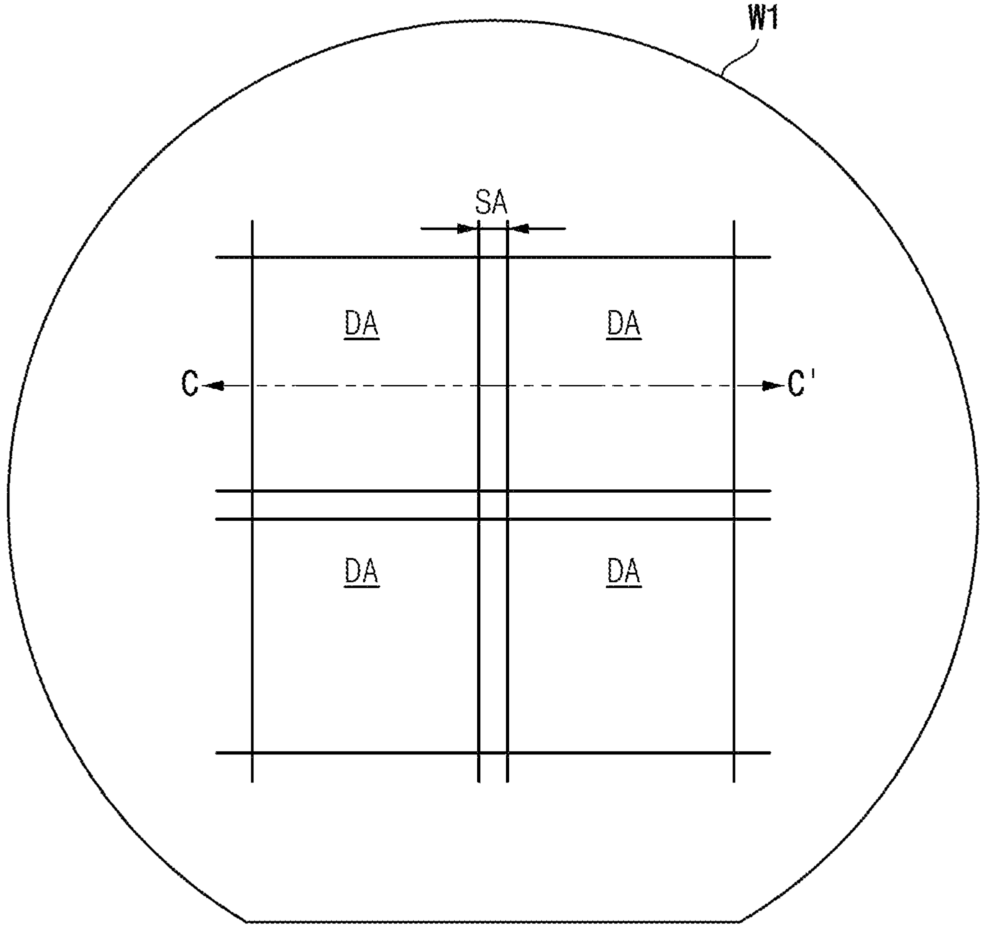
FIGS. 5, 6, 7, 8, 9, 10, 11, 12, 13, 14, 15, 16, 17, 18, 19, 20 and 21 are views illustrating a method of manufacturing a semiconductor package in accordance with an example embodiment of the present inventive concept.
Figure 17:
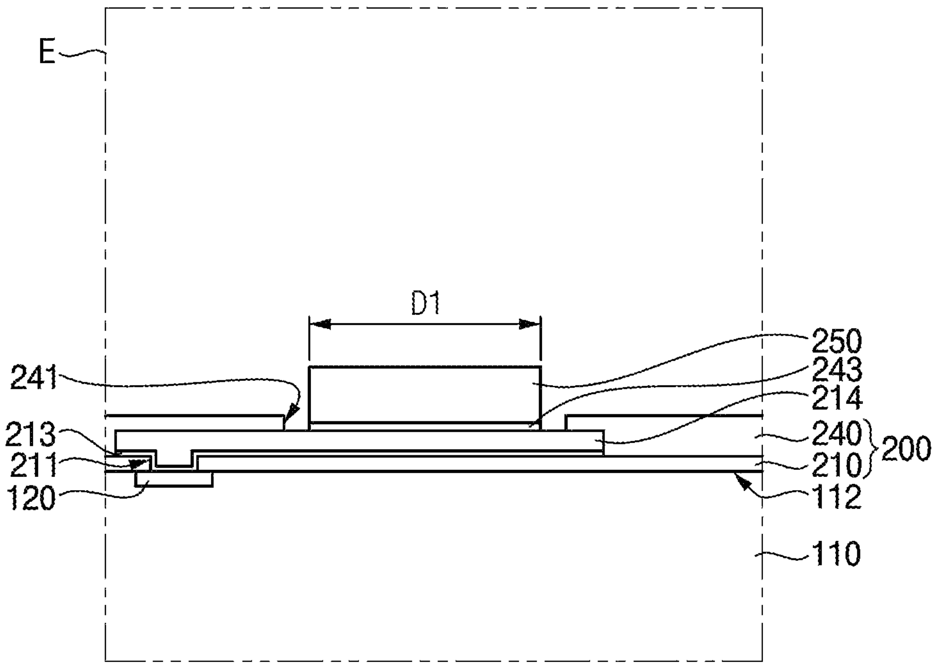
Figure 18:
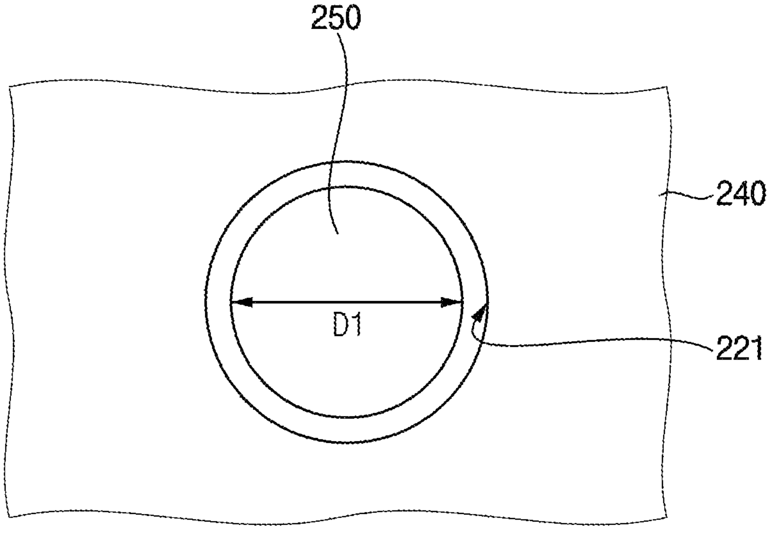

FIGS. 5 to 21 are views illustrating a method of manufacturing a semiconductor package in accordance with an example embodiment of the present inventive concept. FIG. 5 is a plan view illustrating a wafer on which semiconductor chips are formed. FIGS. 6, 7, 16 and 19 are cross-sectional views taken along the line C-C' in FIG. 5. FIGS. 8 to 13 and 15 are enlarged cross-sectional views illustrating portion 'D' in FIG. 7. FIG. 14 is a plan view illustrating a second photoresist pattern in FIG. 13. FIG. 17 is an enlarged cross-sectional view illustrating portion 'E' in FIG. 16. FIG. 18 is a plan view illustrating an UBM pad in FIG. 17. FIG. 20 is an enlarged cross-sectional view illustrating portion 'E' in FIG. 19. FIG. 21 is an enlarged cross-sectional view illustrating portion 'G' in FIG. 20.

Figure 6:
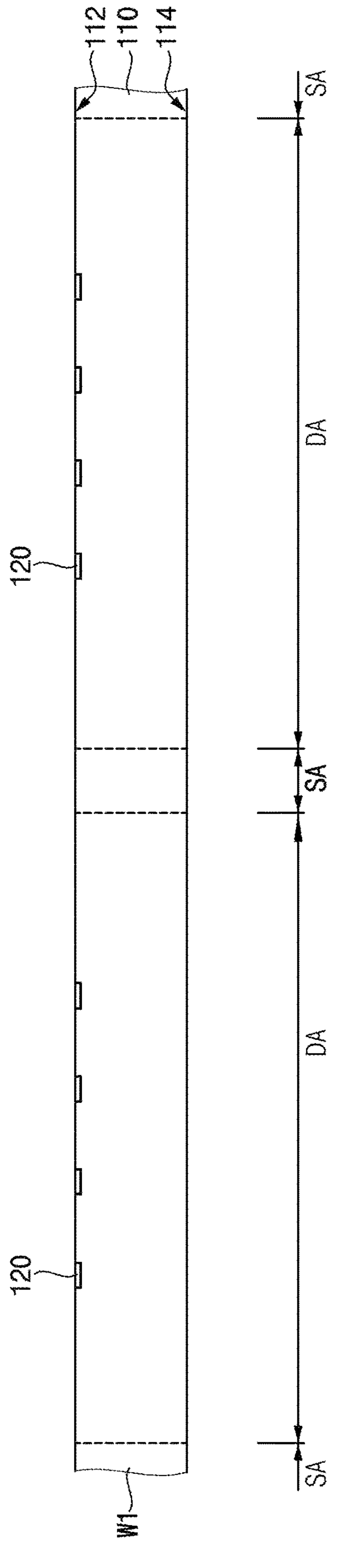

Referring to FIGS. 5 and 6, first, a semiconductor wafer W1 on which a plurality of semiconductor chips are formed may be provided.

In an example embodiment of the present inventive concept, the wafer W1 may include a substrate 110 having a first surface 112 and a second surface 114 that is opposite to the first surface 112. The substrate 110 may include a die region DA and a scribe lane region SA at least partially surrounding the die region DA. The substrate 110 may be cut along the scribe lane region SA that divides a plurality of the die regions DA of the wafer W1 by a following sawing process to be individualized into a plurality of semiconductor chips.

Circuit elements may be formed in the die region DA on the first surface 112 of the substrate 110. For example, the circuit elements may include an integrated circuit for performing power source-related functions such as a power management semiconductor, battery management, a DC-DC converter, etc.

The circuit elements may include a plurality of memory devices. Examples of the memory device may include a volatile semiconductor memory device and a non-volatile semiconductor memory device. Examples of the volatile semiconductor memory device may include DRAM and SRAM. Examples of the non-volatile semiconductor memory device may include EPROM, EEPROM, and Flash EEPROM.

For example, the substrate 110 may include a semiconductor material such as silicon, germanium, silicon-germanium, or a group III-V compound semiconductor such as gallium phosphide (GaP), gallium arsenide (GaAs), or gallium antimonide (GaSb). In an example embodiment of the present inventive concept, the substrate 110 may be a silicon-on-insulator (SOI) substrate or a germanium-on-insulator (GOI) substrate.

The circuit elements may include, for example, transistors, capacitors, wiring structures, etc. The circuit elements may be formed by performing a Fab process called a front end of line (FEOL) process for manufacturing semiconductor devices on the first surface 112 of the substrate 110. A surface of the substrate 110 on which the FEOL process is performed may be referred to as a front side surface of the substrate 110, and a surface opposite to the front side may be referred to as a backside surface. An insulation interlayer may be formed on the first surface 112 of the substrate 110 to cover the circuit elements.

In an example embodiment of the present inventive concept, a plurality of chip pads 120 may be formed on the first surface 112 of the substrate 110. The chip pads 120 may be electrically connected to the circuit elements through contact plugs in the insulation interlayer. A passivation layer may be formed on the insulation interlayer that is on the first surface 112 of the substrate 110. At least portions of the chip pads 120 may be exposed by the passivation layer.

Referring to FIGS. 7 to 18, a redistribution wiring layer 200 may be formed on the first surface 112 of the substrate 110. The redistribution wiring layer 200 may include at least one insulating layer 210 and redistribution wirings 214 provided in the at least one insulating layer 210 and electrically connected to the chip pads 120.

Figure 7:
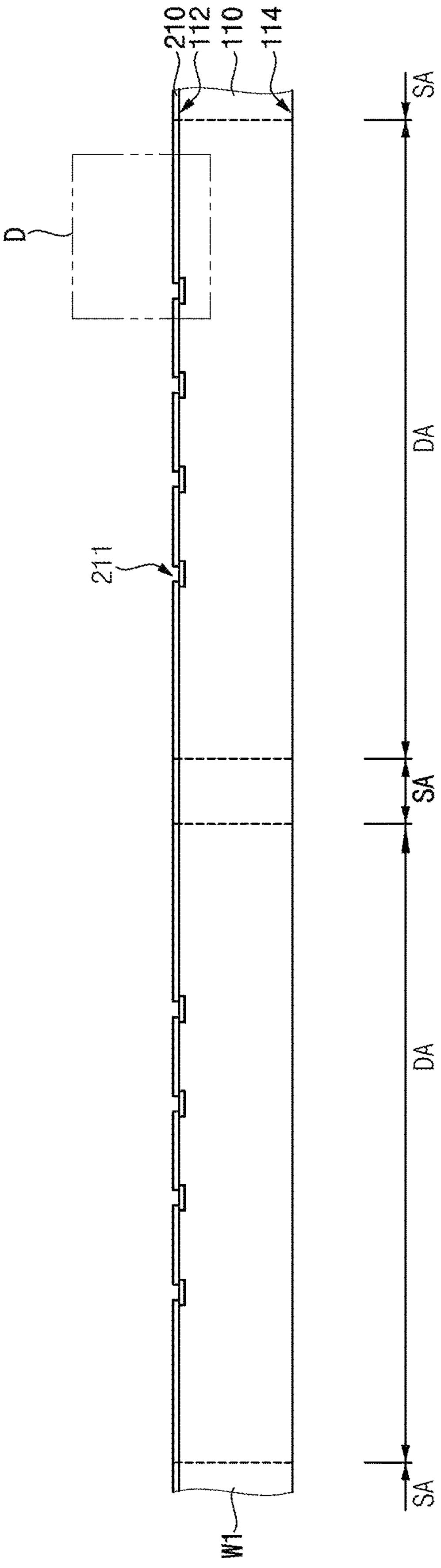
Figure 8:
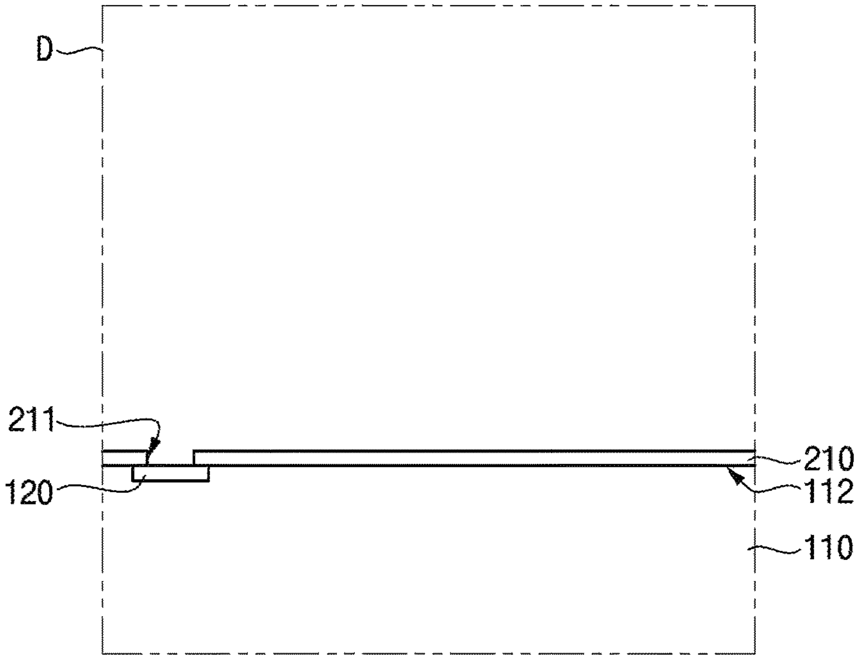

As illustrated in FIGS. 7 and 8, an insulating layer 210 having first openings 211 that expose the chip pads 120 may be formed on the first surface 112 of the substrate 110. The insulating layer 210 may include a polymer or a dielectric layer. For example, the insulating layer 210 may include a photosensitive dielectric layer such as PID (photo imagable dielectric). The insulating layer 210 may be formed by a vapor deposition process, a spin coating process, etc.

Figure 9:
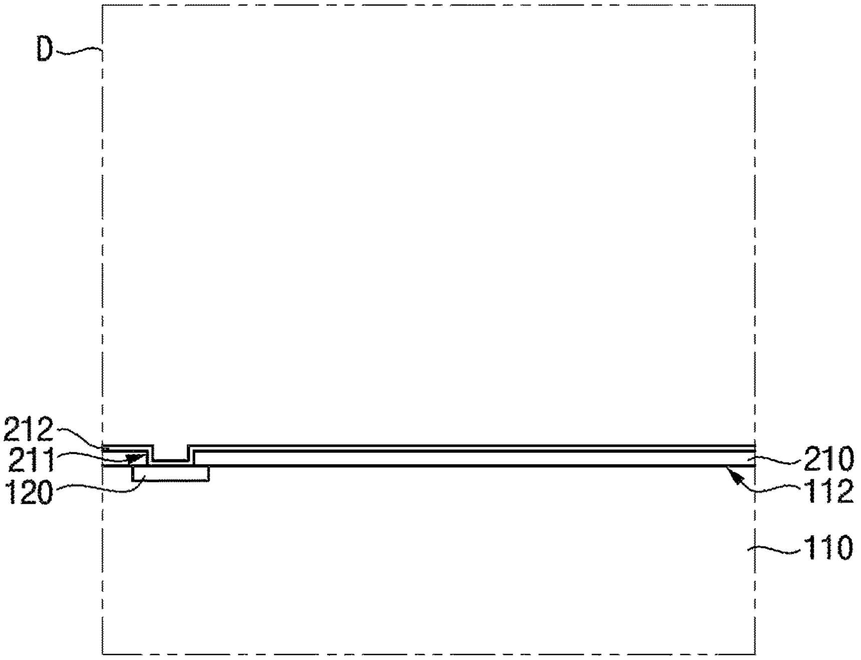
Figure 10:
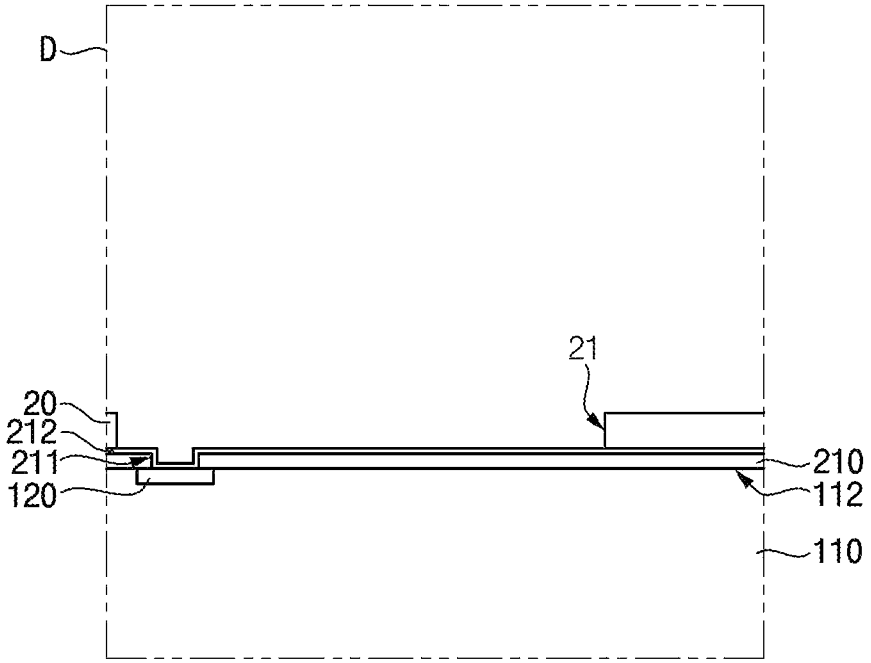
Figure 11:
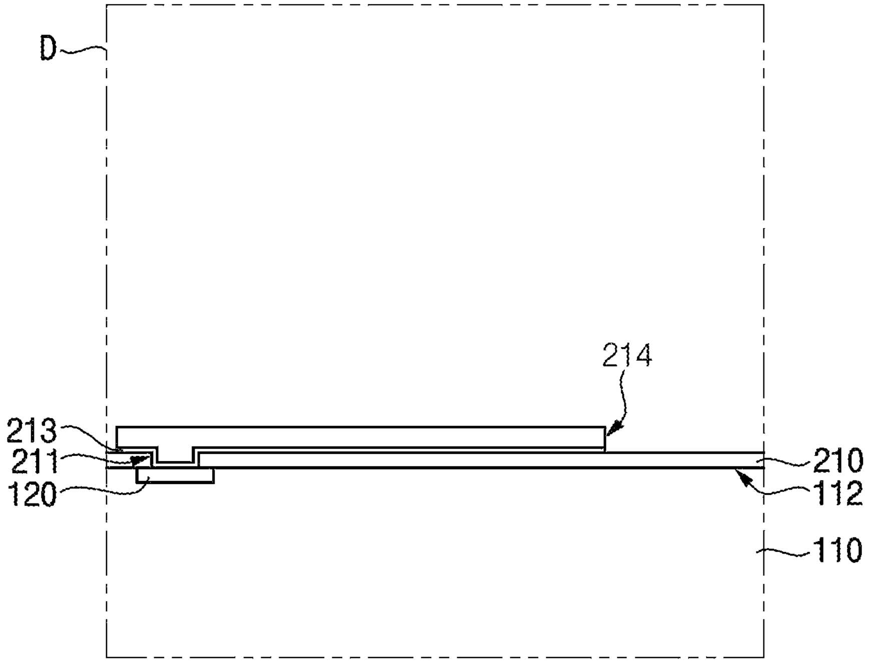

As illustrated in FIGS. 9 to 11, redistribution wirings 214 may be formed on the insulating layer 210 to be electrically connected to the chip pads 120 through the first openings 211.

For example, a first seed layer 212 may be formed on the insulating layer 210 and the chip pads 120 in the first opening 211. A first photoresist pattern 20 having openings 21 that expose redistribution wiring regions may be formed on the first seed layer 212, and an electrolytic plating process may be performed to form the redistribution wirings 214 in the openings 21 of the first photoresist pattern 20. Then, for example, the first photoresist pattern 20 may be removed by a strip process, and portions of the first seed layer 212 that is exposed by the redistribution wirings 214 may be etched to form a first seed layer pattern 213.

The redistribution wiring may include, for example, aluminum (Al), copper (Cu), tin (Sn), nickel (Ni), gold (Au), platinum (Pt), or an alloy thereof. In addition, the redistribution wiring 214 may be formed by an electroless plating process, a vapor deposition process, etc.

Figure 12:
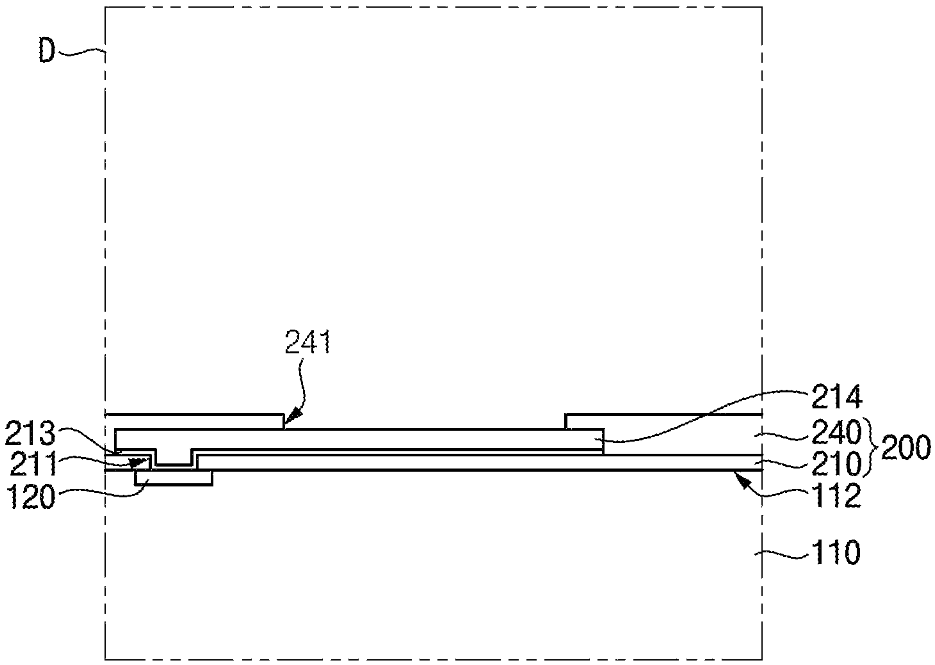

As illustrated in FIG. 12, a protective layer 240 having a second opening 241 that exposes at least a portion of the redistribution wiring 214 may be formed on the insulating layer 210. The protective layer 240 may include a polymer or a dielectric layer. For example, the protective layer 240 may include a photosensitive dielectric layer such as photo imagable dielectric (PID). The protective layer 240 may be formed by, for example, a vapor deposition process, a spin coating process, etc.

Figure 13:
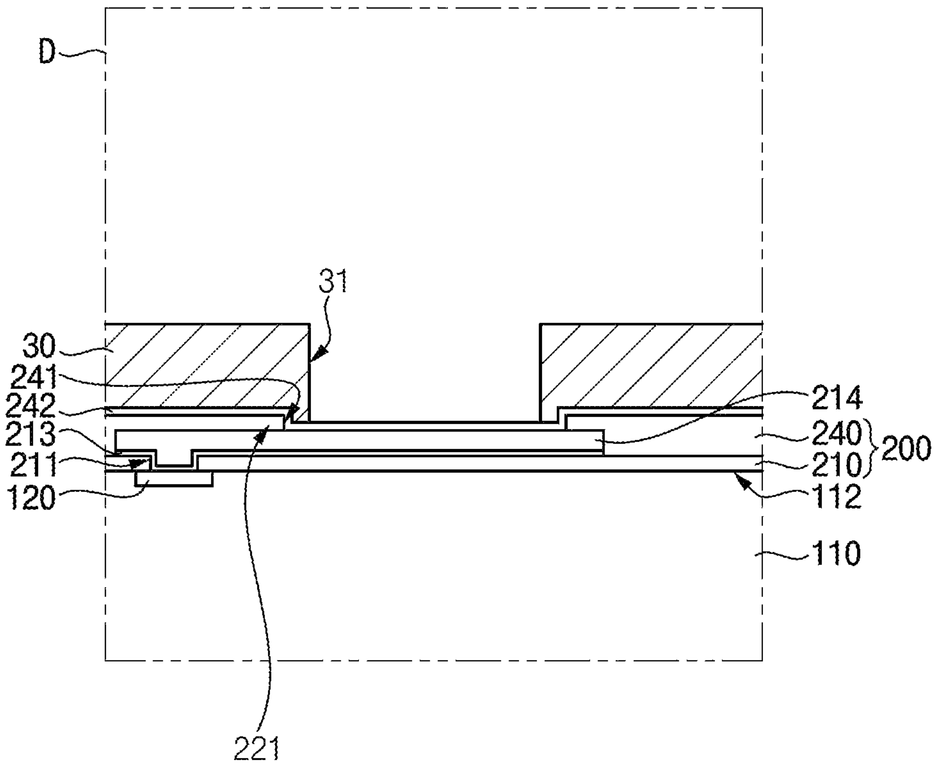
Figure 14:
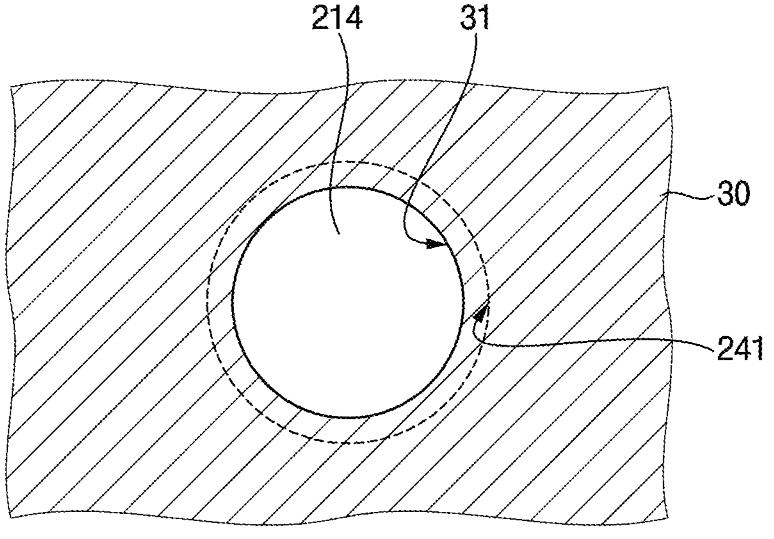
Figure 15:
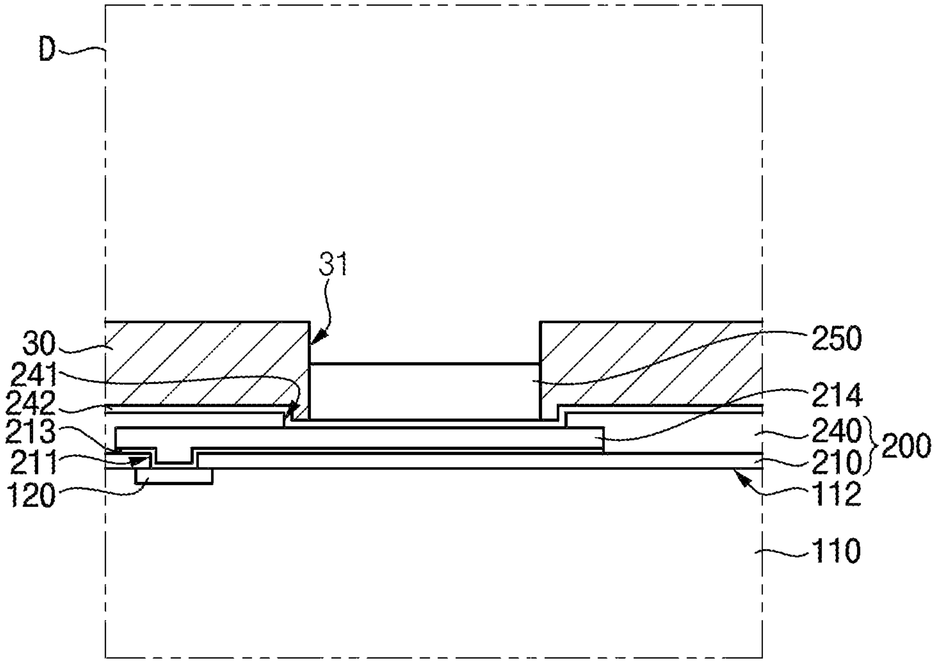
Figure 16:
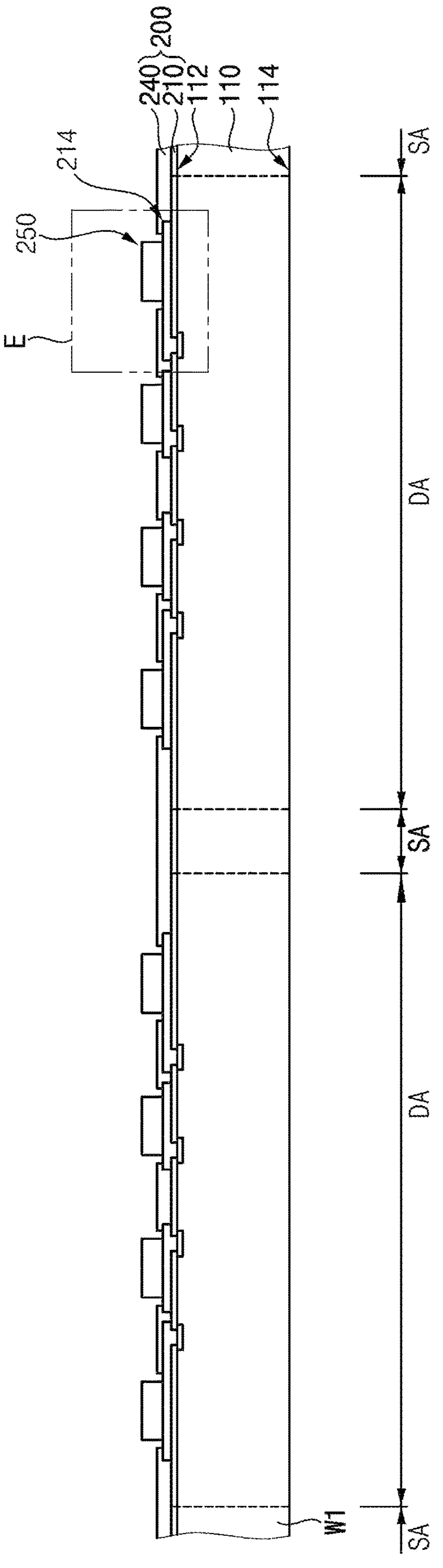

As illustrated in FIGS. 13 and 14, in the second opening 241 of the protective layer 240, a second seed layer 242 may be formed on the protective layer 240 and the redistribution wirings 214, and a second photoresist pattern 30 having openings 31 that expose pad regions may be formed on the second seed layer 242.

The opening 31 of the second photoresist pattern 30 may expose a portion of the redistribution wiring 214 that is spaced apart from a sidewall of the second opening 241 of the protective layer 240. For example, the sidewall of the second opening 241 of the protective layer 240 may be covered by the second photoresist pattern 30.

As illustrated in FIGS. 15 to 18, under bump metallurgy (UBM) pads 250 as bonding pads may be formed in the openings 31 of the second photoresist pattern 30 by performing an electrolytic plating process. Then, the second photoresist pattern 30 may be removed by a strip process, and portions of the second seed layer 242 exposed by the UBM pads 250 may be etched to form a second seed layer pattern 243.

The UBM pad 250 may be spaced apart from an inner wall (e.g., a sidewall) of the second opening 241 of the protective layer 240. A lower surface of the UBM pad 250 may be bonded to a portion of the redistribution wiring 214 that is exposed through the second opening 241. For example, the UBM pad may have a diameter of at least, about, 5 μm.

In this embodiment, the redistribution wiring layer 200 may be formed to include the insulating layer 210, which is formed as one layer, and the redistribution wiring 214 provided on the insulating layer 210. However, the present inventive concept might not be limited thereto, and for example, the redistribution wiring layer 200 may include first and second insulating layers stacked in at least two layers and first and second redistribution wirings respectively provided in the first and second insulating layers. In this case, the second redistribution wiring may correspond to an uppermost redistribution wiring among the redistribution wirings, and the protective layer may be provided on the second insulating layer and may have an opening that expose at least a portion of the uppermost redistribution wiring (second redistribution wiring), and the UBM pad may be formed on the at least a portion of the uppermost redistribution wiring (second redistribution wiring) that is exposed by the opening of the protective layer.

Figure 19:
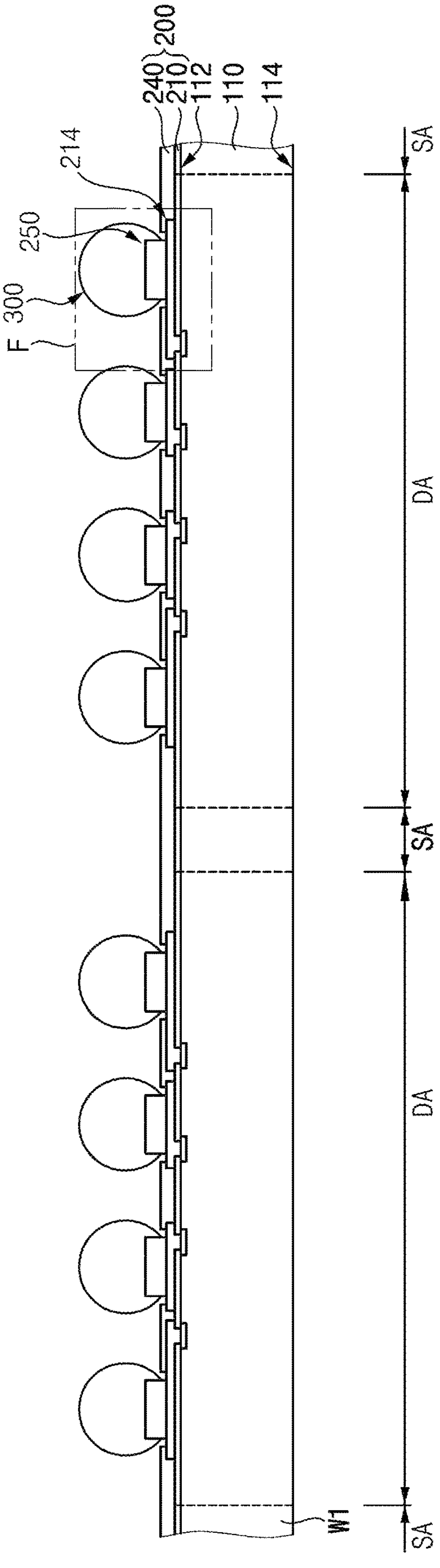
Figure 20:
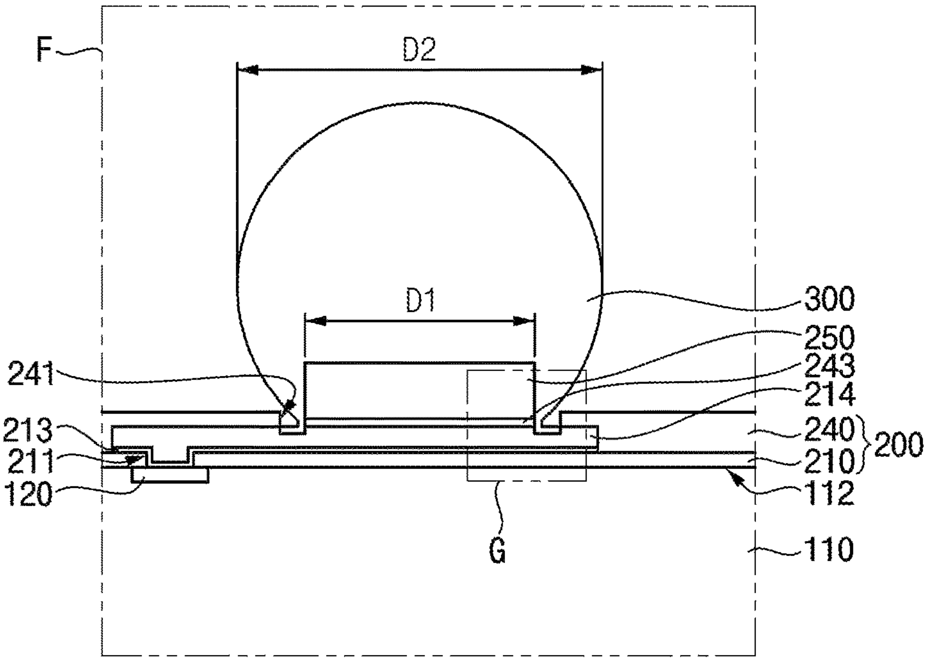
Figure 21:
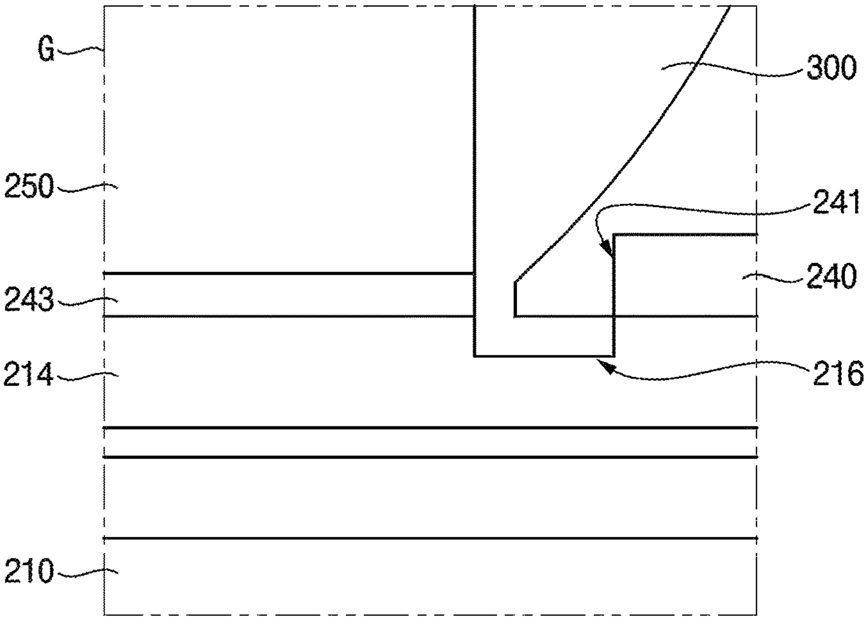

Referring to FIGS. 19 to 21, conductive bumps 300 as external connection members electrically connected to the redistribution wiring layers 214 may be formed on the redistribution wiring layer 200.

For example, the conductive bumps 300 may be respectively formed on the UBM pads 250 by a ball attach process. For example, the conductive bumps 300 may be formed by applying flux to solder bumps or solder balls and performing a reflow process.

The conductive bump 300 may contact a portion of the redistribution wiring 214 that is exposed by the UBM pad 250. The conductive bump 300 may cover the portion of the redistribution wiring 214 that is exposed by the UBM pad 250. For example, the conductive bump 300 may completely cover the portion of the redistribution wiring 214 that is not covered by the UBM pad 250.

As illustrated in FIG. 21, the conductive bump 300 including solder may be reflowed to react with a portion (e.g., copper) of the redistribution wiring 214 that is exposed by the protective layer 240 and the UBM pad 250 to form an intermetallic compound (Cu—Sn). Accordingly, a portion of the redistribution wiring 214 combined with the conductive bump 300 may have an upper surface 216 lower than a portion of the redistribution wiring 214 that is disposed under the protective layer 240.

Then, the wafer W1 may be cut along the scribe lane region SA that divides a plurality of the die regions DA of the wafer W1 to complete the semiconductor package of FIG. 1 including an individualized semiconductor chip on the redistribution wiring layer 200.

Figure 22:
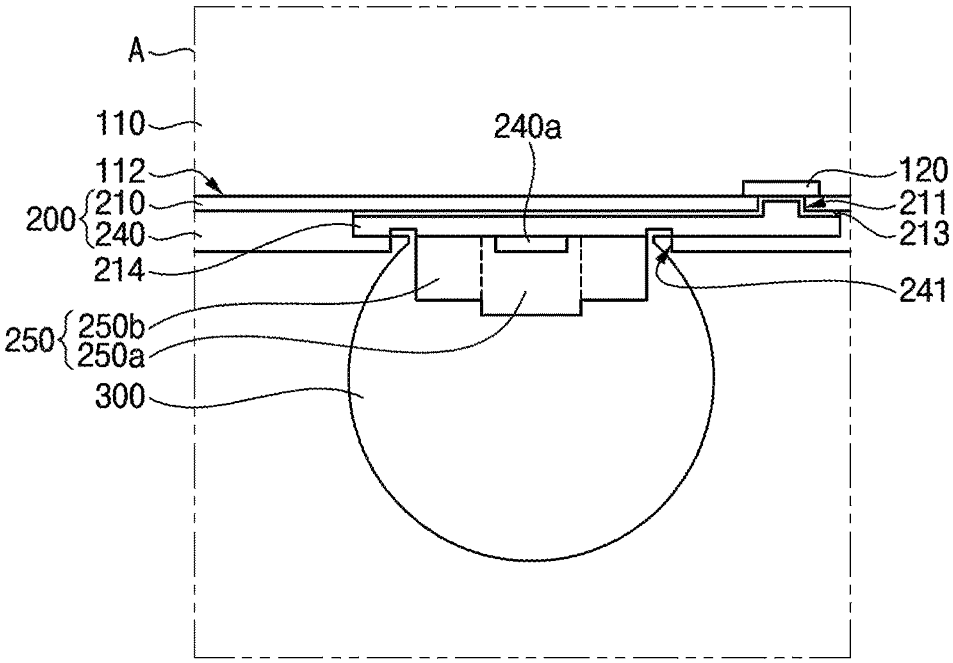
FIG. 22 is a cross-sectional view illustrating a portion of a semiconductor package in accordance with an example embodiment of the present inventive concept.
Figure 23:
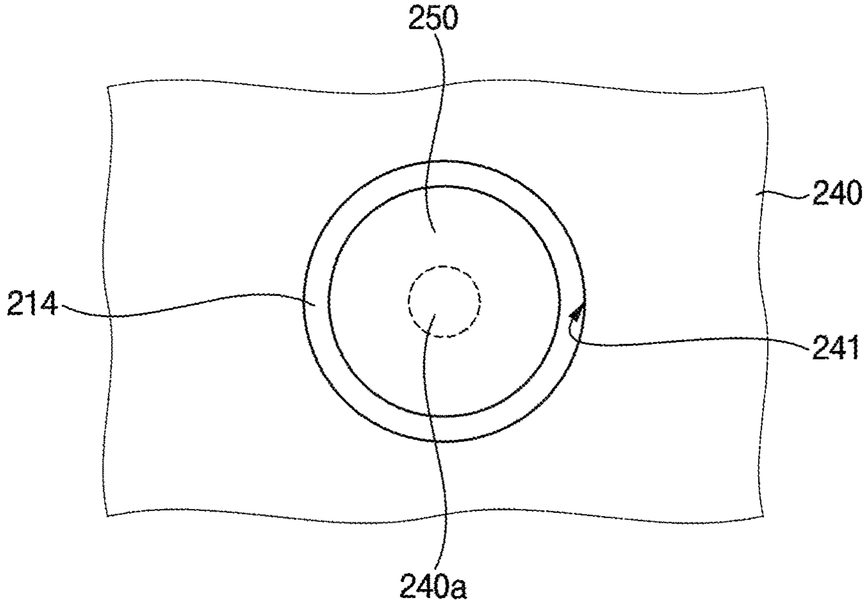
FIG. 23 is a plan view illustrating an UBM pad in FIG. 22.

FIG. 22 is a cross-sectional view illustrating a portion of a semiconductor package in accordance with an example embodiment. FIG. 23 is a plan view illustrating an UBM pad in FIG. 22. FIG. 22 is an enlarged cross-sectional view illustrating portion 'A' in FIG. 1. FIG. 23 is a plan view illustrating the UBM pad, wherein a conductive bump on the UBM pad is omitted. The semiconductor package may be substantially the same as the semiconductor package described with reference to FIGS. 1 to 4 except for a configuration of a protective layer. Thus, same reference numerals will be used to refer to the same or like elements throughout the specification and drawings and any further repetitive explanation concerning the above elements will be omitted or briefly discussed.

Referring to FIGS. 22 and 23, a redistribution wiring layer 200 of a semiconductor package may include an insulating layer 210 formed on a first surface 102 of a semiconductor chip 100, and redistribution wirings 214 may be formed on the insulating layer 210. The redistribution wiring layer 200 may further include a protective layer 240, which is provided on the insulating layer 210 and has a second opening 241 that exposes at least a portion of the redistribution wiring 214, and an UBM pad 250 that is disposed on the at least a portion of the uppermost redistribution wiring 214 that is exposed by the second opening 241. The UBM pad 250 spaced apart from an inner wall of the second opening 241. A conductive bump 300 may be disposed on the UBM pad 250.

The protective layer 240 may further include a central cover pattern 240*a* on the at least a portion of the uppermost redistribution wiring 214 that is exposed by the second opening 241. For example, the central cover pattern 240*a* may have a circular shape. The center of the central cover pattern 240*a* may coincide with the center of the UBM pad 250. The UBM pad 250 may have a diameter greater than a diameter of the central cover pattern 240*a*. A central portion of a lower surface of the UBM pad 250 may cover the central cover pattern 240*a*. A peripheral portion of the lower surface of the UBM pad 250 may cover a portion of the uppermost redistribution wiring 214 that is exposed by the central cover pattern 240*a*.

A central portion 250*a* of the UBM pad 250 may be bonded to the central cover pattern 240*a* including a dielectric layer, and a peripheral portion 250*b* of the UBM pad 250 may be bonded to the redistribution wiring 214 including a metal such as copper, and accordingly, it may be possible to prevent a peeling phenomenon by increasing an interfacial bonding force of the UBM pad 250.

Figure 24:
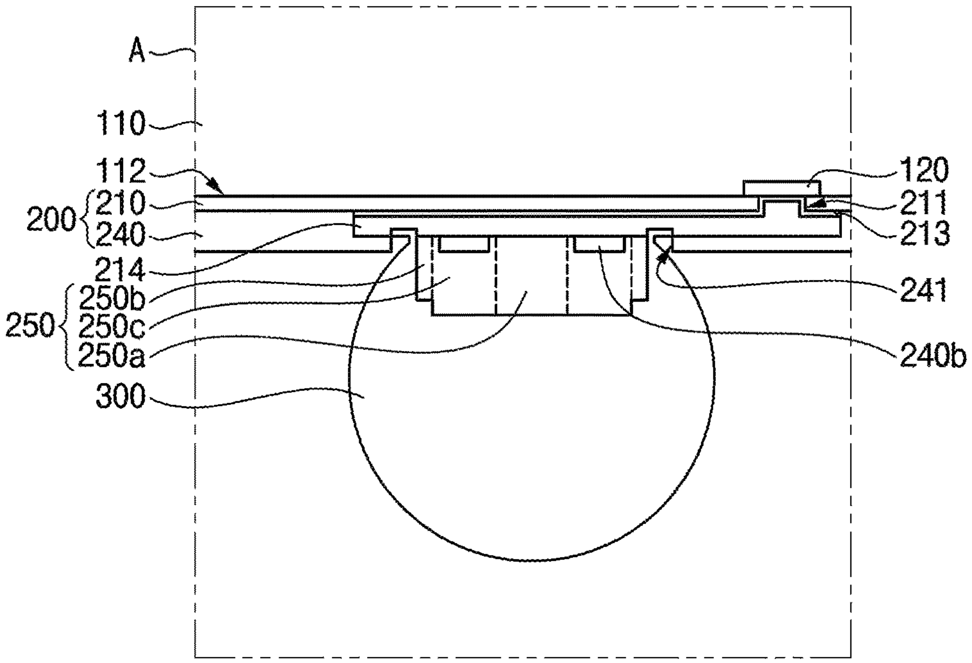
FIG. 24 is a cross-sectional view illustrating a portion of a semiconductor package in accordance with an example embodiment of the present inventive concept.
Figure 25:
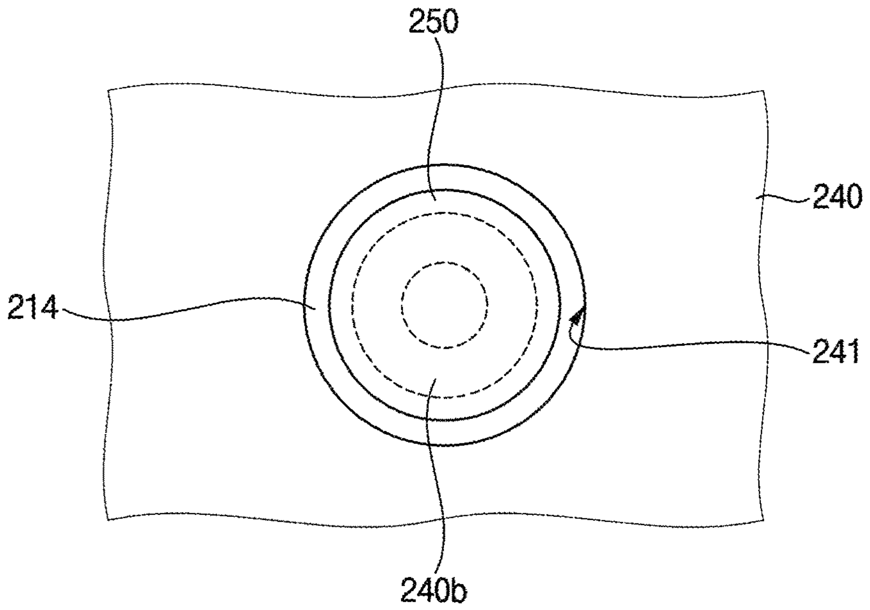
FIG. 25 is a plan view illustrating an UBM pad in FIG. 24.

FIG. 24 is a cross-sectional view illustrating a portion of a semiconductor package in accordance with an example embodiment of the present inventive concept. FIG. 25 is a plan view illustrating an UBM pad in FIG. 24. FIG. 24 is an enlarged cross-sectional view illustrating portion 'A' in FIG. 1. FIG. 25 is a plan view illustrating the UBM pad, wherein a conductive bump on the UBM pad is omitted. The semiconductor package may be substantially the same as the semiconductor package described with reference to FIGS. 1 to 4 except for a configuration of a protective layer. Thus, same reference numerals will be used to refer to the same or like elements and any further repetitive explanation concerning the above elements will be omitted or briefly discussed.

Referring to FIGS. 24 and 25, a redistribution wiring layer 200 of a semiconductor package may include a protective layer 240, which is provided on an insulating layer 210 and has a second opening 241 that exposes at least a portion of a redistribution wiring 214, and an UBM pad 250, which is provided on the at least a portion of the uppermost redistribution 214 that is exposed by the opening 241 and is spaced apart from an inner wall of the second opening 241. A conductive bump 300 may be disposed on the UBM pad 250.

The protective layer 240 may further include a central cover pattern 240*b* on the at least a portion of the uppermost redistribution 214 that is exposed in the second opening 241. The central cover pattern 240*b* may have an annular shape. The center of the central cover pattern 240*b* may coincide (e.g., overlap) with the center of the UBM pad 250. The UBM pad 250 may have a diameter larger than an outer diameter of the central cover pattern 240*b*.

A central portion 250*a* of the UBM pad 250 may cover a portion of the uppermost redistribution wiring 214 that is exposed by the central cover pattern 240*b*. A peripheral portion 250*b* of the UBM pad 250 may cover a portion of the uppermost redistribution wiring 214 that is exposed by the central cover pattern 240*b*. An intermediate portion 250*c* between the central portion 250*a* and the peripheral portion 250*b* of the UBM pad 250 may cover the central cover pattern 240*b*.

The central portion 250*a* of the UBM pad 250 may be bonded to the redistribution wiring 214 including a metal such as copper. The intermediate portion 250*c* of the UBM pad 250 may be bonded to the central cover pattern 240*b* that includes a dielectric layer. The peripheral portion 250*b* of the UBM pad 250 may be bonded to the redistribution wiring 214 including a metal such as copper, and accordingly, it may be possible to prevent a peeling phenomenon by increasing an interfacial bonding force of the UBM pad 250.

Figure 26:
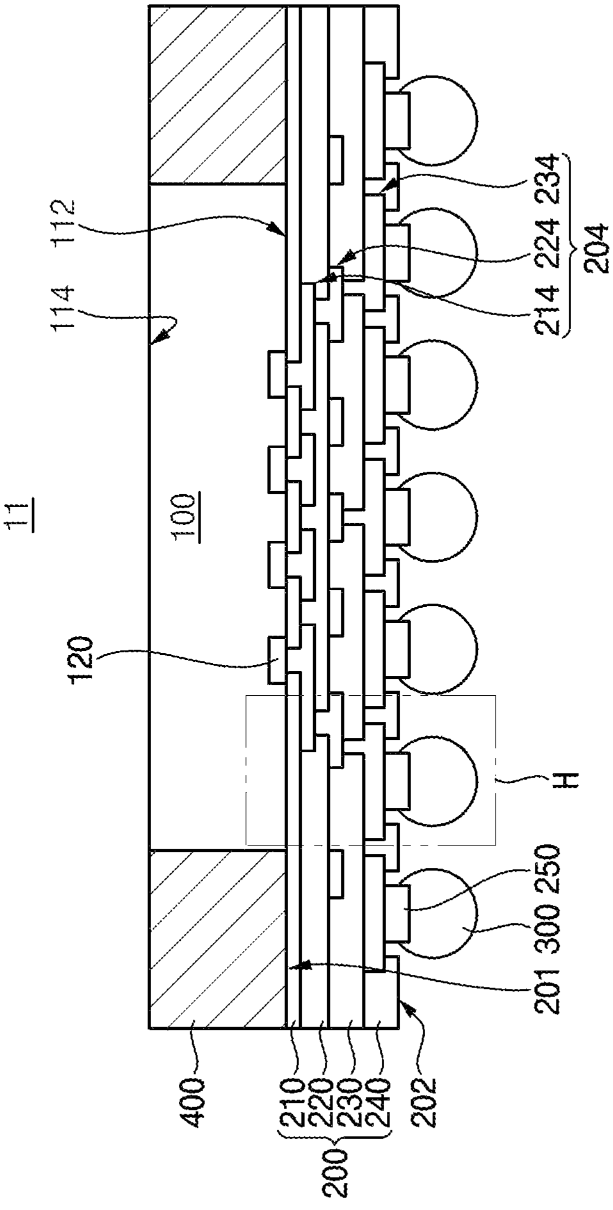
FIG. 26 is a cross-sectional view illustrating a semiconductor package in accordance with an example embodiment of the present inventive concept.
Figure 27:
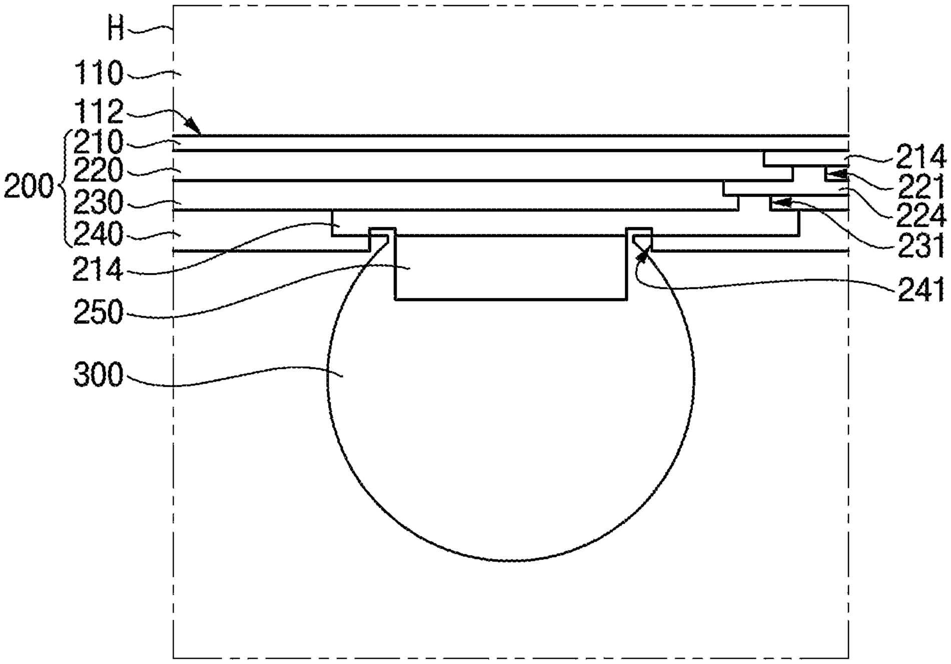
FIG. 27 is an enlarged cross-sectional view illustrating portion 'H' in FIG. 26.

FIG. 26 is a cross-sectional view illustrating a semiconductor package in accordance with an example embodiment of the present inventive concept. FIG. 27 is an enlarged cross-sectional view illustrating portion 'H' in FIG. 26. The semiconductor package is substantially the same as the semiconductor package described with reference to FIGS. 1 to 4 except for a structure of a redistribution wiring layer and an additional molding member. Thus, same reference numerals will be used to refer to the same or like elements throughout the specification and drawings and any further repetitive explanation concerning the above elements will be omitted or briefly discussed.

Referring to FIGS. 26 and 27, a semiconductor package 11 may include a redistribution wiring layer 200, a semiconductor chip 100 disposed on a first surface 201 of the redistribution wiring layer 200, a molding member 400 on the first surface 201 of the redistribution wiring layer 200 and covering at least one side surface of the semiconductor chip 100, and external connection members 300 disposed on a second surface 202 of the redistribution wiring layer 200.

In an example embodiment of the present inventive concept, the semiconductor chip 100 may have a plurality of chip pads 120 on a first surface 110, that is, an active surface. The semiconductor chip 100 may be accommodated in the molding member 400 such that the first surface 112 on which the chip pads 120 are formed faces the redistribution wiring layer 200. A second surface 114 opposite to the first surface 112 of the semiconductor chip 200 may be exposed by the molding member 400. However, the present inventive concept is not limited thereto. For example, the second surface 114 may be covered by the molding member 400.

In an example embodiment of the present inventive concept, the redistribution wiring layer 200 may include at least one insulating layer 210, 220 and 230, and redistribution wirings 204 provided in the at least one insulating layer 210, 220 and 230 and electrically connected to the chip pads 120. The redistribution wiring layer 200 may further include a protective layer 240, which is provided on the at least one insulating layer and has an opening 241 that exposes at least a portion of a lowermost redistribution wiring 234 among the redistribution wirings 204, and an under bump metallurgy (UBM) pad 350, which is disposed on the at least a portion of the lowermost redistribution wiring 234 that is exposed by the opening 241 and is spaced apart from an inner wall of the opening 241.

For example, the redistribution wiring layer 200 may include a first insulating layer 210 formed on a lower surface of the molding member 400 and having first openings that expose the chip pads 120 and first redistribution wirings 214, which are formed on the first insulating layer 210 and are electrically connected to the chip pads 120 through the first openings of the first insulating layer 210.

The redistribution wiring layer 200 may include a second insulating layer 220 formed on the first insulating layer 210 and having second openings 221 that expose the first redistribution wirings 214 and second redistribution wirings 224, which are formed on the second insulating layer 220 and are electrically connected to the first redistribution wirings 214 through the second openings 221 of the second insulating layer 220.

The redistribution wiring layer 200 may include a third insulating layer 230 formed on the second insulating layer 220 and having third openings 231 that expose the second redistribution wirings 224 and third redistribution wirings 234, which are formed on the third insulating layer 234 and are electrically connected to the second redistribution wirings 224 through the third openings 231 of the third insulating layer 230.

The first to third insulating layers 210, 220, and 230 may include a polymer or a dielectric layer. For example, the first to third insulating layers 210, 220, and 230 may include a photosensitive insulating layer such as photo imagable dielectric (PID). The first to third redistribution wirings 214, 224, and 234 may include, for example, aluminum (Al), copper (Cu), tin (Sn), nickel (Ni), gold (Au), platinum (Pt), or an alloy thereof.

The redistribution wirings 204 may include the first to third redistribution wirings 214, 224 and 234 provided in the first to third insulating layers 210, 220 and 230, respectively. The third redistribution wiring 234 may correspond to the lowermost redistribution wiring among the redistribution wirings 204. The number and arrangement of the insulating layers and the redistribution wirings of the redistribution wiring layer are provided as examples, and it will be understood that the present inventive concept is not limited thereto.

The redistribution wiring layer 200 may include a protective layer 240 formed on the third insulating layer 230. The protective layer 240 may have fourth openings 241 that expose the third redistribution wirings 234 that are disposed on the third insulating layer 230.

The redistribution wiring layer 200 may include an under bump metallurgy (UBM) pad 250 as a bonding pad provided on a portion of the third redistribution wiring 234 that is exposed by the fourth opening 241 of the protective layer 240. The UBM pad 250 may be spaced apart from an inner wall of the fourth opening 241 of the protective layer 240.

In an example embodiment of the present inventive concept, conductive bumps 300 as external connection members may be respectively disposed on the UBM pads 250. The conductive bump 300 may contact a portion of the third redistribution wiring 234 that is exposed by the UBM pad 250. The conductive bump 300 may cover the portion of the third redistribution wiring 234 that is exposed by the UBM pad 250.

For example, the conductive bumps 300 may include solder bumps or solder balls.

Hereinafter, a method of manufacturing the semiconductor package of FIG. 26 will be described.

Figure 28:
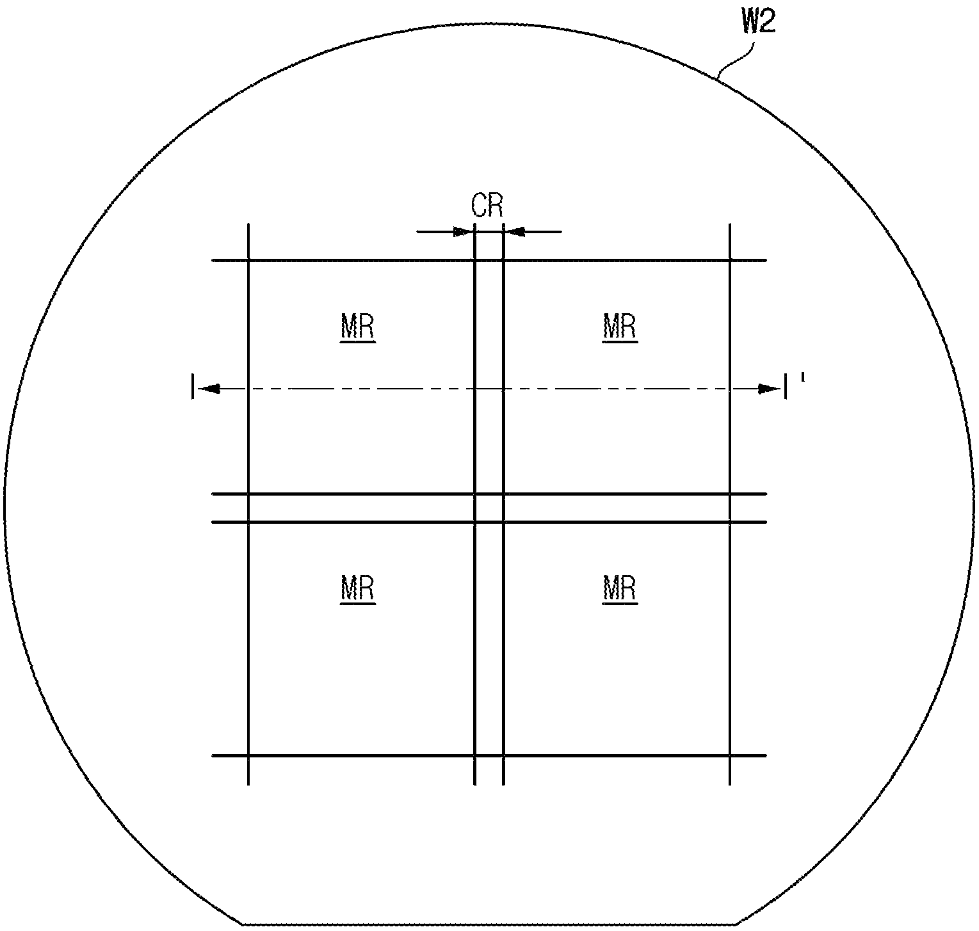
FIGS. 28, 29, 30, 31, 32 and 33 are views illustrating a method of manufacturing a semiconductor package in accordance with example embodiments.
Figure 29:
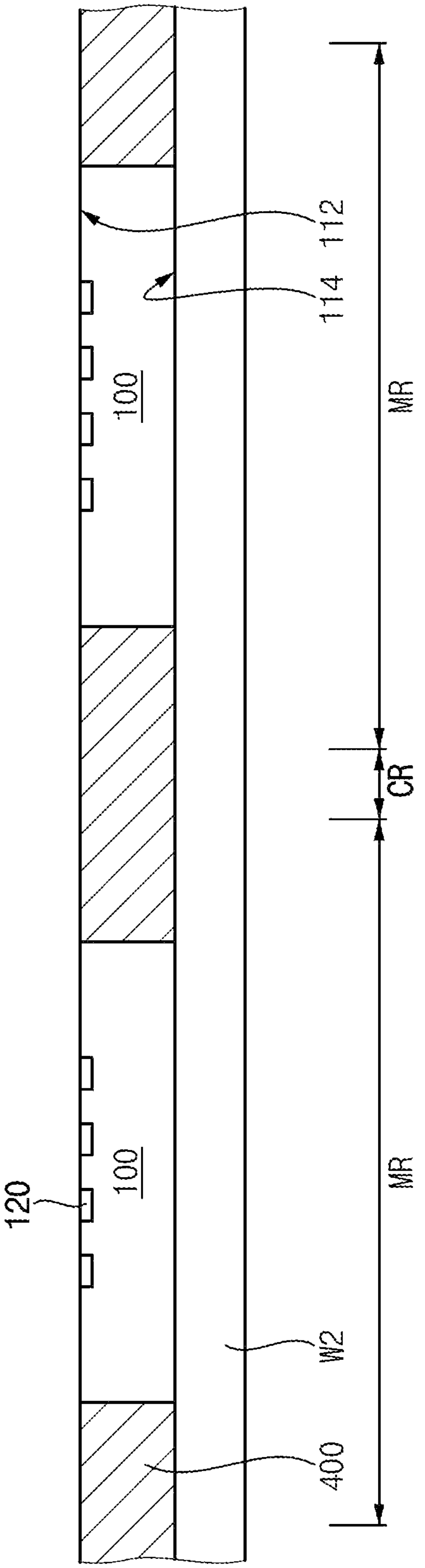
Figure 30:
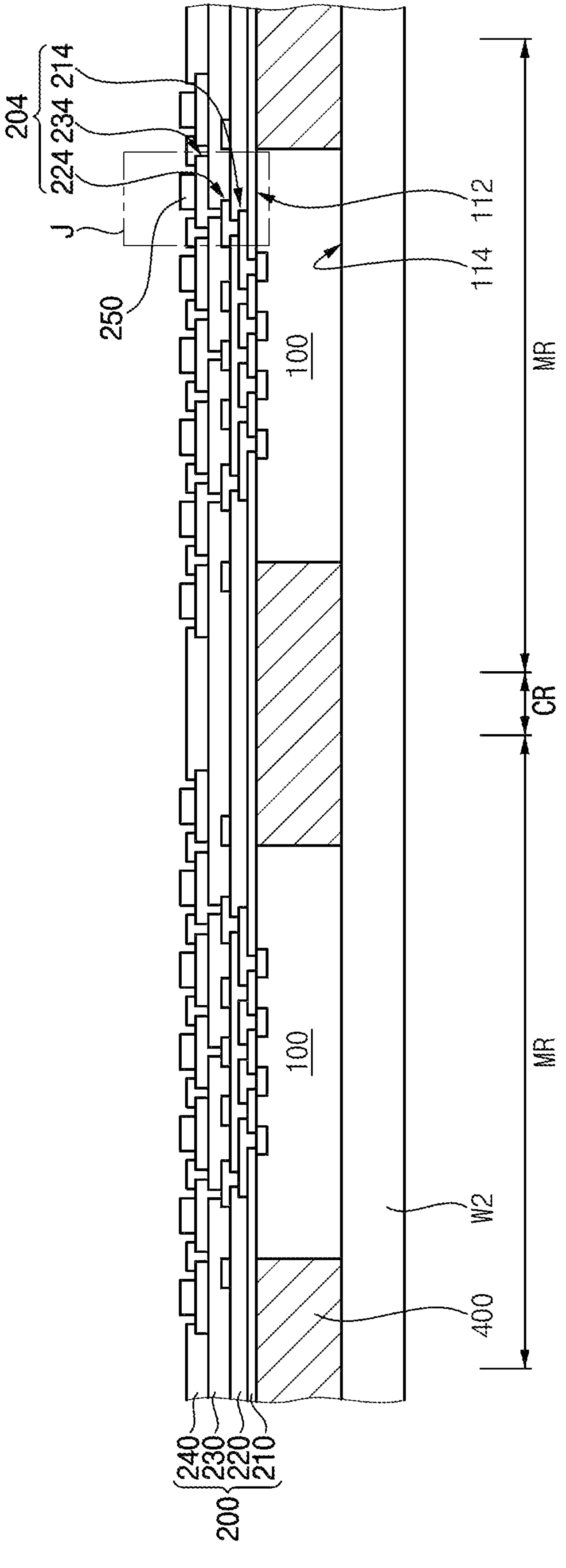
Figure 31:
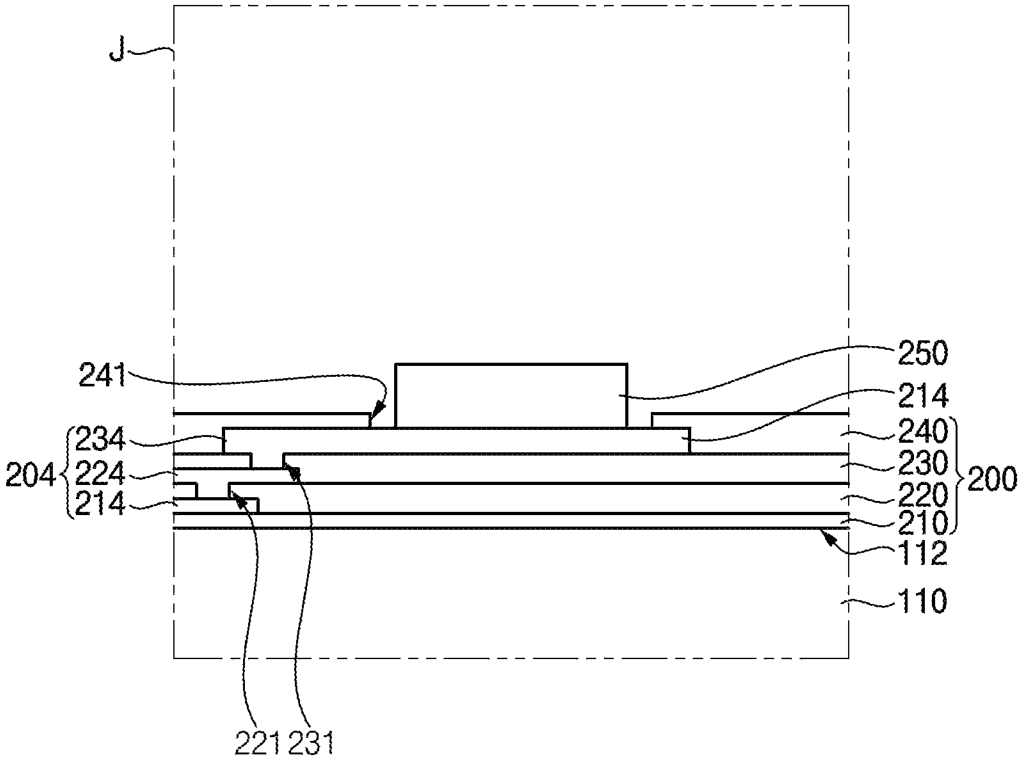
Figure 32:
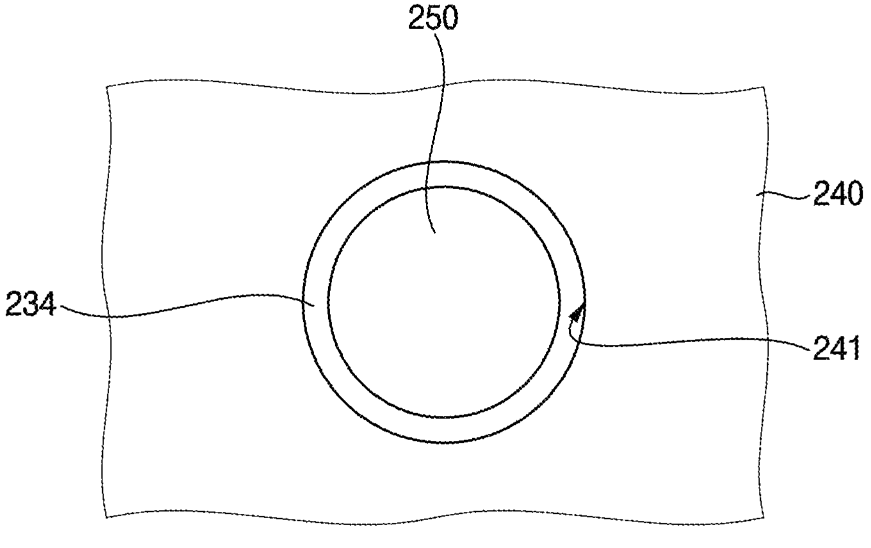
Figure 33:
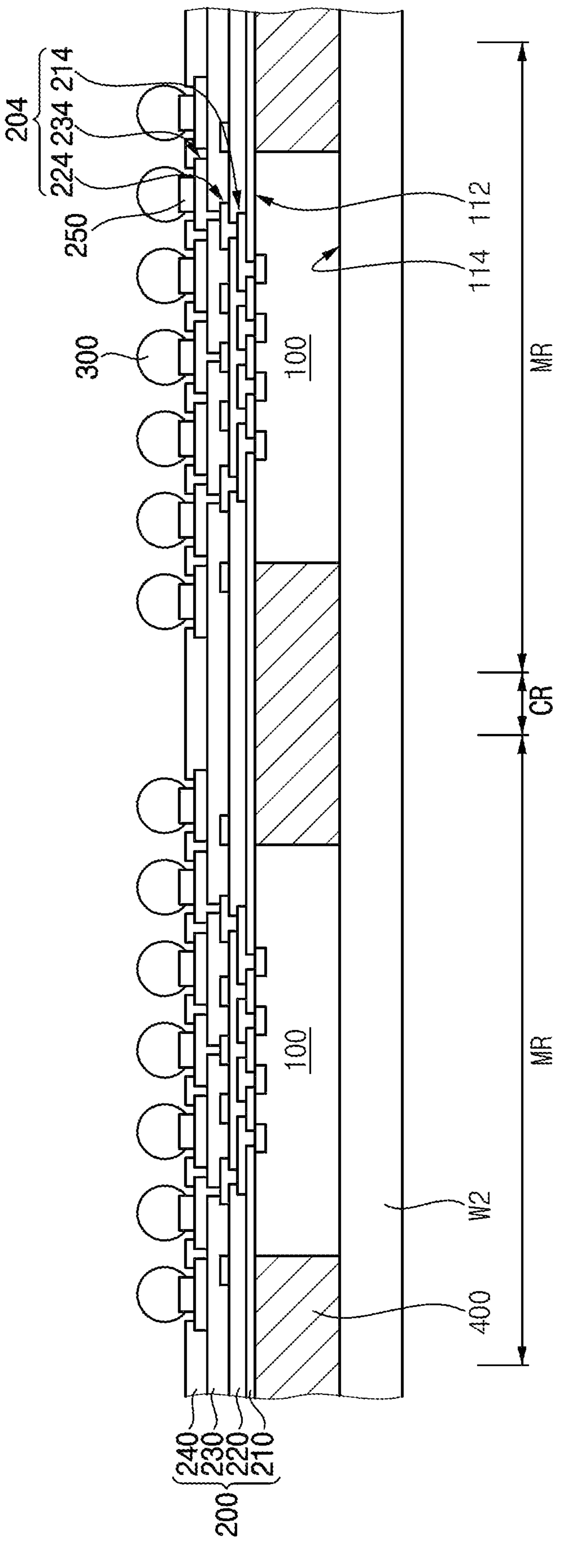

FIGS. 28 to 33 are views illustrating a method of manufacturing a semiconductor package in accordance with an example embodiment of the present inventive concept. FIG. 28 is a plan view illustrating a wafer substrate. FIGS. 29, 30 and 33 are cross-sectional views taken along the line I-I' in FIG. 28. FIG. 31 is an enlarged cross-sectional view illustrating portion 'J' in FIG. 30. FIG. 32 is a plan view illustrating an UBM pad in FIG. 31.

Referring to FIGS. 28 and 29, semiconductor chips 100 may be disposed on a wafer substrate W2, and a molding member 400 may be formed on the wafer substrate W2 to cover the semiconductor chips 100.

In an example embodiment of the present inventive concept, the wafer substrate W2 may be used as a base substrate on which a plurality of semiconductor chips 100 is stacked and a molding member 400 is formed to cover them. The wafer substrate W2 may have a shape corresponding to a wafer on which a semiconductor process is performed. For example, the wafer substrate W2 may include a silicon substrate, a glass substrate, a non-metallic or metallic plate, etc.

The wafer substrate W2 may include a package region MR, in which the semiconductor chip 100 is mounted, and a cutting area CR at least partially surrounding the mounting region MR. As will be described later, the molding member 400 formed on the wafer substrate W2 may be individualized by being cut along the cutting region CR that divides a plurality of the package regions MR.

In an example embodiment of the present inventive concept, the semiconductor chips 100 may be individualized chips obtained by cutting the semiconductor wafer W1 of FIG. 5. The semiconductor chip 100 may be substantially the same as or similar to the semiconductor chip of FIG. 5. Thus, the description of the semiconductor chip 100 will be omitted.

The semiconductor chips 100 may be disposed such that a second surface 114 opposite to a first surface 112, on which chip pads 120 are formed, faces the wafer substrate W2. The semiconductor chip 100 may be attached to the wafer substrate W2 by a separation layer. The separation layer may include a polymer tape acting as a temporary adhesive. The separation layer may include a material capable of losing adhesive strength when it is subjected to light or heat.

Then, the molding member 400 may be formed on the wafer substrate W2 to cover a side surface of the semiconductor chip 100. For example, the molding member 400 may include an epoxy mold compound (EMC). The molding member 400 may be formed by, for example, a molding process, a screen printing process, a lamination process, etc. The molding member 400 may expose the first surface 112 of the semiconductor chip 100 and cover the side surface of the semiconductor chip 100.

Referring to FIGS. 30 to 32, processes the same as or similar to the processes described with reference to FIGS. 7 to 18 may be performed to form a redistribution wiring layer on the first surface 112 of the semiconductor chip 100 and the molding member 400.

In an example embodiment of the present inventive concept, a first insulating layer 210 may be formed on the molding member 400 to having first openings that expose the chip pads 120 of the semiconductor chip 100. The first insulating layer 210 may include a polymer or a dielectric layer. For example, the first insulating layer 210 may include a photosensitive insulating layer such as photo imagable dielectric (PID). The first insulating layer 210 may be formed by, for example, a vapor deposition process, a spin coating process, etc.

Then, first redistribution wirings 214 may be formed on the first insulating layer 210 to be electrically connected to the chip pads 120 through the first openings of the first insulating layer 210.

The first redistribution wiring 214 may be formed by forming a seed layer on a portion of the first insulating layer 110 and the chip pad 120 in the first opening, and then performing an electrolytic plating process on the seed layer. In addition, the first redistribution wiring 214 may be formed by, for example, an electroless plating process, a vapor deposition process, etc.

Then, a second insulating layer 220 and second redistribution wirings 224 may be formed on the first insulation layer 210 and the first redistribution wirings 214. The second insulating layer 220 may have second openings 221 that expose the first redistribution wirings 214 on the first insulating layer 210. The second redistribution wiring 224 may be formed on a portion of the second insulating layer 220 and a portion of the first redistribution 214.

Then, a third insulating layer 230 and third redistribution wirings 234 may be formed on the second insulation layer 230 and the second redistribution wirings 224. The third insulating layer 230 may have third openings 231 that expose the second redistribution wirings 224 on the second insulating layer 220. The third redistribution wiring 234 may be formed on a portion of the third insulating layer 230 and a portion of the second redistribution 224.

Accordingly, the redistribution wiring layer 200 having redistribution wirings 204 electrically connected to the chip pads 120 may be formed on the first surface 112 of the semiconductor chip 100. The redistribution wiring layer 200 may include the first to third insulating layers 210, 220 and 230 sequentially stacked on one another. The redistribution wirings 204 may include the first to third redistribution wirings 214, 224 and 234 provided in the first to third insulating layers 210, 220 and 230, respectively. The third redistribution wiring 234 may correspond to an uppermost redistribution wiring among the redistribution wirings 204, when the first surface 112 is facing an upward direction. The number and arrangement of the insulating layers and the redistribution wirings of the redistribution wiring layer are provided as examples, and it will be understood that the present inventive concept is not limited thereto.

Then, a protective layer 240 may be formed on the third insulating layer 230. The protective layer 240 may have fourth openings 241 that exposing the uppermost redistribution wirings 234 that is disposed on the third insulating layer 230. Under bump metallurgy (UBM) pads 250 as bonding pads may be formed on the uppermost redistribution wirings 234 and in the fourth openings 241 of the protective layer 240. The UBM pad 250 may be spaced apart from an inner wall of the fourth opening 241 of the protective layer 240.

Referring to FIG. 33, processes the same as or similar to the processes described with reference to FIGS. 19 to 21 may be performed to form conductive bumps as external connection members that are electrically connected to the redistribution wirings 204 that are on the redistribution wiring layer 200.

For example, the conductive bumps 300 may be respectively formed on the UBM pads 250 by a ball attach process. The conductive bumps 300 may be formed by applying flux to solder bumps or solder balls and performing a reflow process.

The conductive bump 300 may contact a portion of the uppermost redistribution wiring 234 that is exposed by the UBM pad 250. The conductive bump 300 may cover the portion of the redistribution wiring 234 exposed by the UBM pad 250.

Then, the wafer substrate W2 may be cut along the cutting region CR that divides a plurality of the mounting regions MR of the wafer substrate W2 to complete the semiconductor package 11 of FIG. 26 including the fan-out type redistribution wiring layer 200.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

While the present inventive concept has been described with reference to example embodiments thereof, it will be understood by those of ordinary skill in the art that various changes in form and details may be made thereto without departing from the spirit and scope of the present inventive concept.

What is claimed is:

1. A semiconductor package, comprising:

a semiconductor chip having chip pads disposed on a first surface thereof;

a redistribution wiring layer formed on the first surface of the semiconductor chip, wherein the redistribution wiring layer includes at least one insulating layer, redistribution wirings, a protective layer, and an under bump metallurgy (UBM) pad of UBM pads, wherein the at least one insulating layer is formed on the first surface of the semiconductor chip, wherein the redistribution wirings are provided on the at least one insulating layer and are electrically connected to the chip pads, wherein the protective layer is provided on the at least one insulating layer and has an opening that exposes at least a portion of a first redistribution wiring of the redistribution wirings, and wherein the under bump metallurgy (UBM) pad is provided on the at least a portion of the first redistribution wiring that is exposed by the opening of the protective layer and spaced apart from an inner wall of the opening of the protective layer; and conductive bumps disposed on the UBM pads of the redistribution wiring layer, wherein the conductive bumps contact a portion of the redistribution wiring that is exposed by the opening of the protective layer.

2. The semiconductor package of claim 1, wherein a conductive bump of the conductive bumps contacts a portion of the first redistribution wiring that is exposed by the UBM pad of the UBM pads.

3. The semiconductor package of claim 1, wherein a conductive bump of the conductive bumps covers a portion of the first redistribution wiring that is exposed by the UBM pad of the UBM pads.

4. The semiconductor package of claim 1, wherein a lower surface of the UBM pad of the UBM pads is bonded to the at least a portion of the first redistribution wiring that is exposed by the opening.

5. The semiconductor package of claim 1, wherein the UBM pad of the UBM pads has a diameter of at least 5 μm.

6. The semiconductor package of claim 1, wherein the protective layer includes a photo imagable dielectric (PID).

7. The semiconductor package of claim 1, wherein the UBM pad of the UBM pads and the first redistribution wiring include copper, and the conductive bumps include solder.

8. The semiconductor package of claim 1, wherein the protective layer further includes a central cover pattern disposed on the at least a portion of the first redistribution wiring that is exposed by the opening of the protective layer.

9. The semiconductor package of claim 8, wherein the central cover pattern has a circular or annular shape.

10. The semiconductor package of claim 1, further comprising:

a molding member covering side surfaces of the semiconductor chip, and wherein the redistribution wiring layer is disposed on a lower surface of the molding member to cover the first surface of the semiconductor chip.

11. A semiconductor package, comprising:

A semiconductor chip having chip pads disposed on a first surface thereof;

a redistribution wiring layer covering the first surface of the semiconductor chip and having redistribution wirings electrically connected to the chip pads; and conductive bumps disposed on an outer surface of the redistribution wiring layer and electrically connected to the redistribution wirings, wherein the redistribution wiring layer includes:

at least one insulating layer in which the redistribution wirings are provided;

a protective layer provided on the at least one insulating layer and having an opening that exposes at least a portion of a first redistribution wiring among the redistribution wirings; and a bonding pad provided on the at least a portion of the first redistribution wiring that is exposed by the opening of the protective layer and spaced apart from an inner wall of the opening of the protective layer, and wherein a conductive bump of the conductive bumps is disposed on the bonding pad, wherein the conductive bumps contact a portion of the redistribution wiring that is exposed by the opening of the protective layer.

12. The semiconductor package of claim 11, wherein the conductive bump completely covers a portion of the first redistribution wiring that is exposed by the bonding pad.

13. The semiconductor package of claim 11, wherein an entire lower surface of the bonding pad is bonded to the at least a portion of the first redistribution wiring that is exposed by the opening of the protective layer.

14. The semiconductor package of claim 11, wherein the bonding pad has a diameter of at least, 5 μm.

15. The semiconductor package of claim 11, wherein the protective layer includes a photo imagable dielectric (PID).

16. The semiconductor package of claim 11, wherein the bonding pad and the first redistribution wiring include copper, and the conductive bumps include solder.

17. The semiconductor package of claim 11, wherein the protective layer further comprises a central cover pattern disposed on the at least a portion of the first redistribution wiring that is exposed by the opening of the protective layer.

18. The semiconductor package of claim 17, wherein the central cover pattern has a circular or annular shape.

19. The semiconductor package of claim 11, further comprising:

a molding member covering side surfaces of the semiconductor chip, and wherein the redistribution wiring layer is disposed on a lower surface of the molding member to cover the first surface of the semiconductor chip.

20. A semiconductor package, comprising:

a redistribution wiring layer having a first surface and a second surface that is opposite to the first surface, wherein the redistribution wiring layer includes at least one insulating layer and redistribution wirings provided in the at least one insulating layer;

a semiconductor chip arranged on the first surface of the redistribution wiring layer and having chip pads that are electrically connected to the redistribution wirings; and outer connection members disposed on the second surface of the redistribution wiring layer and electrically connected to the redistribution wirings, wherein the redistribution wiring layer further includes:

a protective layer provided on the at least one insulating layer and having an opening that exposes at least a portion of a first redistribution wiring among the redistribution wirings; and a bonding pad provided on the at least a portion of the first redistribution wiring that is exposed by the opening of the protective layer and is spaced apart from an inner wall of the opening of the protective layer, and wherein an outer connection member of outer connection members is arranged on the bonding pad and covers a portion of the first redistribution wiring that is exposed by the bonding pad, wherein an outer connection member of outer connection members contacts a portion of the at least a portion of the first redistribution wiring that is exposed by the opening of the protective layer.

* * * * *